US012492963B2

(12) United States Patent
Gwosch et al.

(10) Patent No.: US 12,492,963 B2
(45) Date of Patent: Dec. 9, 2025

(54) METHOD FOR DETERMINING AN IMAGING QUALITY OF AN OPTICAL SYSTEM WHEN ILLUMINATED BY ILLUMINATION LIGHT WITHIN AN ENTRANCE PUPIL TO BE MEASURED

(71) Applicant: Carl Zeiss SMT GmbH, Oberkochen (DE)

(72) Inventors: Klaus Gwosch, Aalen (DE); Markus Koch, Neu-Ulm (DE); Lars Stoppe, Jena (DE); Manuel Decker, Jena (DE); Lukas Fischer, Leinfelden-Echterdingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 491 days.

(21) Appl. No.: 17/664,773

(22) Filed: May 24, 2022

(65) Prior Publication Data

US 2022/0381643 A1 Dec. 1, 2022

(30) Foreign Application Priority Data

May 31, 2021 (DE) .......................... 102021205541.9

(51) Int. Cl.
*G03F 7/00* (2006.01)
*G01M 11/02* (2006.01)
(Continued)

(52) U.S. Cl.
CPC ...... *G01M 11/0264* (2013.01); *G01M 11/005* (2013.01); *G01M 11/0257* (2013.01); *G02B 27/0081* (2013.01); *G03F 7/706* (2013.01)

(58) Field of Classification Search
CPC ........... G01M 11/0264; G01M 11/005; G01M 11/0257; G01M 11/02; G01M 11/02;
(Continued)

(56) References Cited

U.S. PATENT DOCUMENTS 5,982,490 A 11/1999 Ichikawa et al.
2003/0133099 A1* 7/2003 Shiode .................. G03F 1/44
356/124
(Continued)

FOREIGN PATENT DOCUMENTS

CN 106575088 A 4/2017
DE 10220815 A1 11/2003
(Continued)

OTHER PUBLICATIONS

Mateusz, Decomposition of the total wave aberration in generalized optical systems, Oct. 2017, Journal of the Optical Society of America, vol. 34, No. 10, pp. 1856-1865 (Year: 2017) (Year: 2017).*

(Continued)

*Primary Examiner* — Michelle M Iacoletti
*Assistant Examiner* — Judy Dao Tran
(74) *Attorney, Agent, or Firm* — Fish & Richardson P.C.

(57) ABSTRACT

To determine an imaging quality of an optical system when illuminated by illumination light within an entrance pupil or exit pupil, a test structure is initially arranged in an object plane of the optical system and an illumination angle distribution for illuminating the test structure with the illumination light is specified. The test structure is illuminated at different distance positions relative to the object plane. An intensity of the illumination light is measured in an image plane of the optical system, the illumination light having been guided by the optical system when imaging the test structure at each distance position. An aerial image measured in this way is compared with a simulated aerial image and fit parameters of a function set for describing the simulated aerial image are adapted and a wavefront of the optical system is determined on the basis of the result of a minimized difference.

20 Claims, 15 Drawing Sheets

(51) Int. Cl.
*G01M 11/00* (2006.01)
*G02B 27/00* (2006.01)

(58) Field of Classification Search
CPC .......... G01M 11/0271; G02B 27/0081; G03F 7/706; G03F 7/70666; G03F 7/20; G03F 1/84; G03F 7/70591; G01N 21/956
See application file for complete search history.

(56) References Cited

U.S. PATENT DOCUMENTS

| | | | |
|---|---|---|---|
| 2005/0286755 A1* | 12/2005 | Maali | G06T 7/001 382/151 |
| 2013/0063716 A1 | 3/2013 | Mann et al. | |
| 2013/0083321 A1 | 4/2013 | Wack et al. | |
| 2014/0071261 A1 | 3/2014 | Yamazoe | |
| 2015/0355052 A1* | 12/2015 | Stoppe | G03F 7/706 356/124 |
| 2016/0298951 A1* | 10/2016 | Schulte | G01B 9/021 359/207.1 |
| 2018/0357758 A1 | 12/2018 | Matejka et al. | |
| 2019/0258170 A1* | 8/2019 | Koch | G01M 11/0264 |
| 2019/0391087 A1* | 12/2019 | Matejka | G01B 9/02083 250/358 |
| 2020/0116558 A1 | 4/2020 | Pacala et al. | |
| 2020/0218160 A1 | 7/2020 | Kruithof et al. | |

FOREIGN PATENT DOCUMENTS

| | | |
|---|---|---|
| DE | 10220816 A1 | 11/2003 |
| DE | 102013219524 A1 | 4/2015 |
| DE | 102013226668 A1 | 6/2015 |
| DE | 102014210641 A1 | 12/2015 |
| DE | 102015213163 A1 | 1/2017 |
| DE | 102017216703 A1 | 3/2019 |
| JP | 2002-022609 A | 1/2002 |
| JP | 2002-075843 A | 3/2002 |
| JP | 2014-055882 A | 3/2014 |
| JP | 2015-517095 A | 6/2015 |
| JP | 2017-054062 A | 3/2017 |
| JP | 2020-060470 A | 4/2020 |
| KR | 10-0654784 B1 | 12/2006 |
| TW | 201435297 A | 9/2014 |
| TW | 202011045 A | 3/2020 |
| WO | WO 03/021352 A1 | 3/2003 |
| WO | WO 2013/139483 A2 | 9/2013 |
| WO | WO 2020/225411 A1 | 11/2020 |
| WO | WO2016012426 A1 | 7/2021 |

OTHER PUBLICATIONS

Yang, "Generalized shift-rotation absolute measurement method for optical surface shapes with polygonal apertures based on migration recognition by Radon transform", Jun. 8, 2020, Applied Optics, vol. 59, pp. 5158-5166 (Year: 2020).*
Extended European Search Report for EP Application No. 22 173 143.3, dated Nov. 3, 2022.
Japanese Office Action, with English translation, for corresponding JP Appl No. 2022-088414, dated Jun. 26, 2023.
Taiwanese Office Action and Search Report, with English translation, for corresponding TW Appl No. 111 120 065, dated Feb. 7, 2023.
Taiwanese Office Action, with English translation, for corresponding TW application No. 111 120 065, dated Oct. 6, 2023.
German Examination Report, with translation thereof, for corresponding DE Appl No. 10 2021 205 541.9, dated Feb. 25, 2022.
S. Van Haver, "The Extended Nijboer-Zernike Diffraction Theory and its Applications," 2010, http://resolver.tudelft.nl/unid:8496ba75-24da-4e31-a750-1bc348155061.
D. Su et al., "Absolute surface figure testing by shift-rotation method using Zernike polynomials," Optics Letters vol. 37, No. 15, 3198-3200, 2012, https:/doi.org/10.1364/OL.37.003198.
Y. Liu, et. al., "Extended shift-rotation method for absolute interferometric testing of a spherical surface with pixel-level spatial resolution," Applied Optics vol. 56, No. 16, 2017, https://doi.org/10.1364/AO.56.004886.
http://de.wikipedia.org/wiki/Schmidtsches_Orthonormalisierungsverfahren with English translation.
D. Malacara, "Optical Shop Testing", Wiley-Interscience, 1992.
Japanese Office Action, with translation thereof, for corresponding JP Appl No. 2022-088414, dated Nov. 9, 2023.
South Korean Office Action, with translation thereof, for corresponding KR Application No. 10-2022-0066061, dated Jun. 25, 2024.
Office Action in corresponding Chinese Appln. No. 202210608419. X, mailed on Feb. 13, 2025, 16 pages (with English translation).

* cited by examiner $I(x,y,z_m)$

METHOD FOR DETERMINING AN IMAGING QUALITY OF AN OPTICAL SYSTEM WHEN ILLUMINATED BY ILLUMINATION LIGHT WITHIN AN ENTRANCE PUPIL TO BE MEASURED

CROSS-REFERENCE TO RELATED APPLICATION

This application claims benefit under 35 U.S.C. § 119 of German patent application DE 10 2021 205 541.9, filed May 31, 2021, which hereby is incorporated by reference in its entirety.

FIELD

The disclosure relates to a method for determining an imaging quality of an optical system when illuminated by illumination light within an entrance pupil to be measured.

BACKGROUND

A metrology system for measuring an aerial image of a lithography mask in three dimensions is known from WO 2016/012 426 A1. DE 10 2013 219 524 A1 describes a device and a method for determining an imaging quality of an optical system, and an optical system. DE 10 2013 219 524 A1 has described a phase retrieval method for determining a wavefront on the basis of the imaging of a pinhole.

SUMMARY

The present disclosure seeks to provide a method for determining an imaging quality of an optical system as flexibly as possible in relation to the pupil to be measured.

In a first aspect, the disclosure provides a method for determining an imaging quality of an optical system when illuminated by illumination light within an entrance pupil to be measured and/or within an exit pupil to be measured, including the following steps:
arranging a test structure in an object plane of the optical system;
specifying an illumination angle distribution for illuminating the test structure with the illumination light;
illuminating the test structure with the specified illumination angle distribution at different distance positions of the test structure relative to the object plane;
measuring an intensity of the illumination light in an image plane of the optical system using a spatially resolving detection device for the purposes of determining a measured aerial image of the test structure, the illumination light having been guided by the optical system when imaging the test structure at each distance position;
comparing the measured aerial image with a simulated aerial image and adapting fit parameters of a function set for describing the simulated aerial image until a difference between the measured aerial image and the simulated aerial image has been minimized;
determining a wavefront of the optical system on the basis of the result of the minimized difference between the measured and the simulated aerial image, the specified illumination angle distribution corresponding to a subaperture within the pupil to be measured;
repeating the specifying to determining steps using a further specified subaperture which is shifted relative to the already measured subaperture in the pupil to be measured; and
determining the wavefront of the optical system by combining the results obtained for the measured subapertures over the entire pupil to be measured.

According to the disclosure, it was recognized that the determination of the imaging quality on the basis of an aerial image measurement does not require a pupil that is to be measured to be illuminated in its entirety during a single measurement. Rather, it is possible to carry out the measurement sequentially using subapertures within the pupil to be measured, the measurement results obtained via the various subapertures then being combined. In the case of the specified illumination angle distribution over a subaperture within the pupil to be measured, an appropriate subaperture stop can be introduced into an entrance pupil of a projection optical unit of the optical system and can be positioned transversely to the illumination light beam path such that this yields a desired illumination direction in accordance with specified pupil coordinates. It is also possible to register and measure unconventional shapes of pupils to be measured by way of an appropriate coverage by way of subapertures. The pupil to be measured can be an elliptical pupil, a round pupil or else a pupil delimited by a free-form shape. A pixel resolution of the spatially resolving detection device can be adapted to the numerical apertures of the pupil to be measured. A greater pixel resolution of the detection device is chosen for a higher numerical aperture. In each subaperture measurement, the wavefront of the optical system in this subaperture can be deduced with the aid of a phase retrieval method, which is known in principle from the literature, for example from DE 10 2013 219 524 A1. To optimize the determination of the difference, use can be made of a projection method (error reduction algorithm, Gerchberg-Saxton method, IFTA method) and/or a conventional iterative optimization method (gradient descent, least square, damped least square, genetic search method, simplex, Chambolle-Pock optimization, back propagation method) and/or a direct inversion method (Extended Nijboer Zernike Decomposition (S. Van Haver, The Extended Nijboer-Zernike Diffraction Theory and its Applications, 2010, http://resolver.tudelft.nl/uuid:8d96ba75-24da-4e31-a750-1bc348155061), database-based method, machine learning method).

In some embodiments, the pupilis scanned by way of the subapertures. Such a scan of the pupil by way of the subapertures can facilitate a well comparable method procedure. The scan of the pupil by way of the subapertures can be implemented by exactly one line of subapertures. Alternatively, a scan over a plurality of subaperture lines is also possible. The scan can be such that a chief ray polar angle of the illumination light remains constant. In this case, in general, the test structure is always illuminated with the same chief ray angle of incidence. In one variant, there can be a multi-line scan even with a plurality of lines with a chief ray polar angle that is constant within a line in each case, the chief ray polar angle changing between the lines.

In some embodiments, the method includes eliminating a test structure contribution to an influence on the wavefront by the test structure for the purposes of the test structure-independent determination of the imaging quality of the optical system. Such embodiments can improve the result of the method by virtue of eliminating test structure contributions that systematically falsify the determination of the imaging quality.

In some embodiments, the test structure contribution is determined for exactly one specified subaperture and this contribution is then also used for the test structure-independent determination of the imaging quality of the optical system for the further subapertures. In such embodiments, an outlay associated with determining the test structure contribution can be reduced. The test structure contribution determined once for exactly one specified subaperture can be post-processed or converted for the purposes of eliminating the test structure contribution in the case of the other subapertures, for example by rotating the test structure contribution in accordance with an illumination angle, for example a chief ray azimuth angle, assigned to the respective subaperture.

In some embodiments, a linear system of equations for determining the imaging quality is solved while eliminating the test structure contribution, wherein data of the wavefront determination prior to the elimination of the test structure contribution, contributions of the test structure, and a transformation matrix are included in the linear system of equations. Such embodiments have proven their worth in practice. Exponents of such methods are known as shift-rotation methods. Examples of such a shift-rotation method can be found in the specialist article by D. Su et al. Absolute surface figure testing by shift-rotation method using Zernike polynomials, Optics Letters Vol. 37, No. 15, 3198-3200, 2012, https://doi.org/10.1364/OL.37.003198; Y. Liu, et. al., Extended shift-rotation method for absolute interferometric testing of a spherical surface with pixel-level spatial resolution, Applied Optics Vol. 56, No. 16, 2017, https://doi.org/10.1364/AO.56.004886, DE 10 2013 226 668 A1 and U.S. Pat. No. 5,982,490A.

In some embodiments, a dependence, on a respective coordinate in the solution space to be determined is described by way of a decomposition into basis functions, of: the data of the wavefront determination prior to the elimi-nation of the test structure contribution; of the contributions of the test structure; and/or of the transformation matrix. Such embodiments have proven their worth in practice. The following can be used as basis functions: Zernike polynomials, Bhatia-Wolf polynomials, Bessel functions, solutions to the Laplace equation, orthogonalized, locally distributed, narrow exponential functions and/or Gaussian functions (optionally distributed on a grid), orthogonalized, locally distributed spline polynomials (optionally distributed on a grid) and orthogonalized mixtures of basis functions. By way of example, such an orthogonalization can be implemented using the Gram-Schmidt orthogonalization method (Korn and Korn, "Mathematical Handbook for Scientists and Engineers", McGraw-Hill, 1968; D. Malacara, "Optical Shop Testing", Wiley-Interscience, 1992; http://de.wikipedia.org/wiki/Schmidtsches_Orthonormalisierungsverfahren).

In some embodiments, a pinhole is used as the test structure. Such a pinhole as a test structure has proven its worth in practice.

In some embodiments, the pinhole has an elliptical edge. Such an elliptical pinhole was found to be particularly suitable for determining aberrations in the case of anamorphic imaging systems, that is to say imaging systems with different imaging scales in mutually perpendicular planes. Such an elliptical pinhole was found to be also particularly suitable for determining aberrations in the case of isomorphic imaging systems with an elliptical entrance pupil.

In some embodiments, the pupil to be determined has an elliptical edge, there being, within the determination of the wavefront, a representation of a pupil function for the at least sectional description of the pupil to be determined on a coordinate grid that is equidistant in mutually perpendicular pupil coordinates and parameterized basis functions that are scaled in accordance with a principal axis ratio of an elliptical edge of the pupil. Such embodiments were found to be particularly suitable for implementation in the determination method.

In some embodiments, the pupil to be determined has an elliptical edge, there being, within the determination of the wavefront, a representation of a pupil function for the at least sectional description of the pupil to be determined on a coordinate grid that is scaled in mutually perpendicular pupil coordinates in accordance with a principal axis ratio of an elliptical edge of the pupil and parameterized basis functions that are scaled uniformly. Such embodiments were found to be particularly suitable for implementation in the determination method.

In some embodiments, the disclosure provides a metrology system for carrying out a method as disclosed above. The metrology system has an illumination optical unit for illuminating the test structure and having an imaging optical unit, the imaging quality of which is intended to be determined, for imaging the test structure toward a spatially resolving detection device. Features of such a measuring system correspond to those which explained above with reference to the determination methods.

The present disclosure also seeks to provide a metrology system of the type set forth at the outset, in such a way that a phase retrieval method, for example according to the prior art, is also made available for an elliptical pupil to be measured.

In a second aspect, the disclosure provides a metrology system having: a holder for a test structure; an illumination optical unit for illuminating the test structure in an object plane specified by the holder; a spatially resolving detection device; an imaging optical unit for imaging the test structure toward the detection device in an image plane; and a stop with an aperture with an elliptical edge, arranged in an illumination pupil plane and/or in an entrance pupil of the imaging optical unit.

According to the disclosure, it was recognized that an elliptical pupil can be measured directly by using a stop with an elliptical edge that is arranged in a pupil plane of the metrology system, and can be used to determine a wavefront by way of a phase retrieval method. In this way, such a metrology system can be used to determine, for example, the imaging quality of an optical system when illuminated with illumination light within the entrance pupil to be measured and/or within an exit pupil to be measured. In the phase retrieval method, use can be made of basis functions parameterized in scaled fashion, for example compressed Zernike polynomials and/or scaled coordinate grids and uniformly scaled parameterized basis functions, in accordance with the determination method explained above.

In some embodiments, the metrology system is for carrying out a method as described above. Features of such a metrology system to those explained above with reference to the determination method.

BRIEF DESCRIPTION OF THE DRAWINGS

Exemplary embodiments of the disclosure are explained in more detail below with reference to the drawings, in which.

EXEMPLARY EMBODIMENTS

Figure 1:
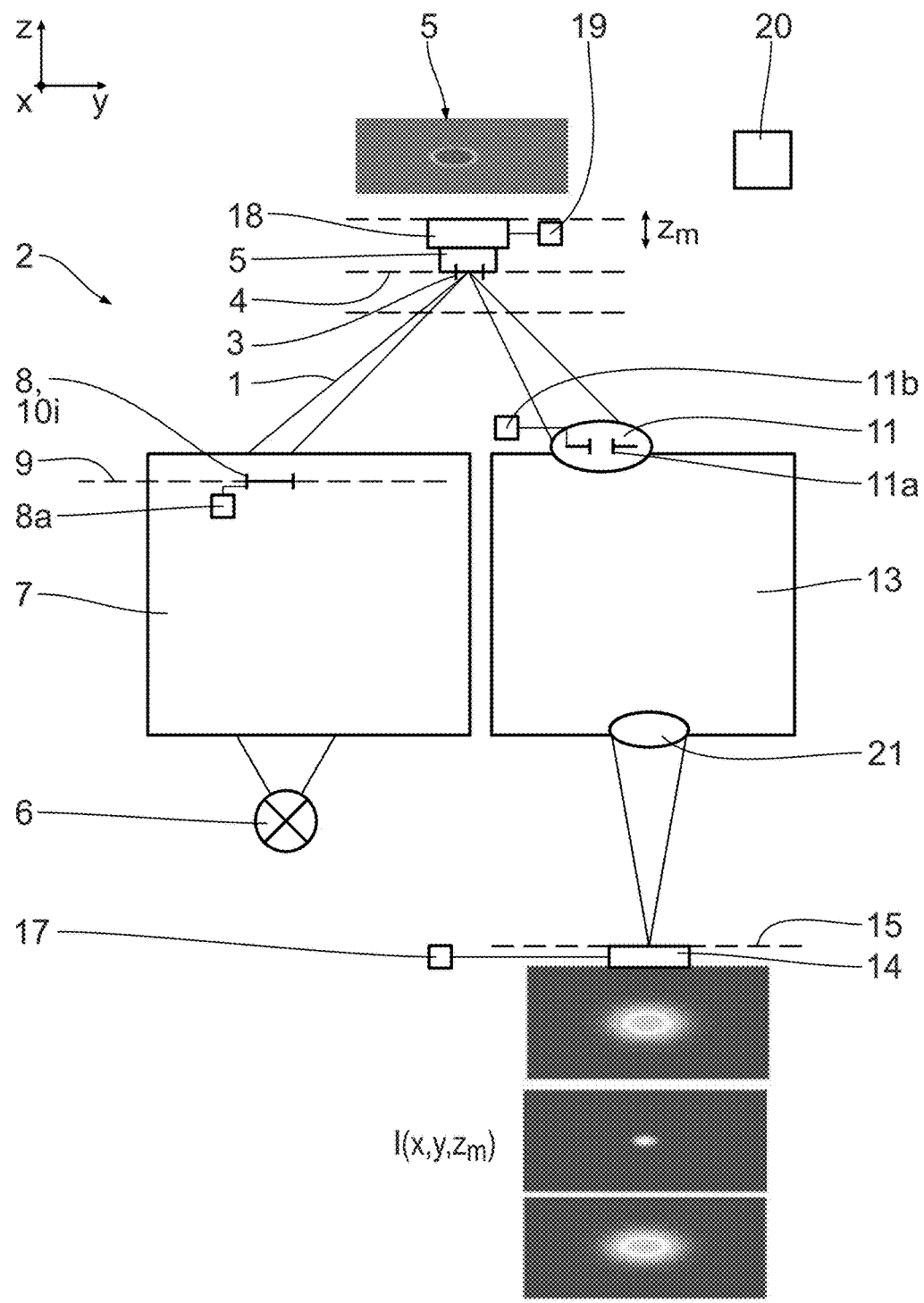
FIG. 1 very schematically shows a plan view, with a direction of view perpendicular to a plane of incidence, of a metrology system for determining an imaging quality of an optical system when illuminated with illumination light within an entrance pupil to be measured, comprising an illumination optical unit and an imaging optical unit, both of which are respectively represented very schematically.

In order to facilitate the representation of positional relationships, a Cartesian xyz-coordinate system is used hereinafter. In FIG. 1, the x-axis runs perpendicularly to the plane of the drawing and out of the latter. The y-axis runs towards the right in FIG. 1. In FIG. 1, the z-axis runs upwards.

Figure 9:
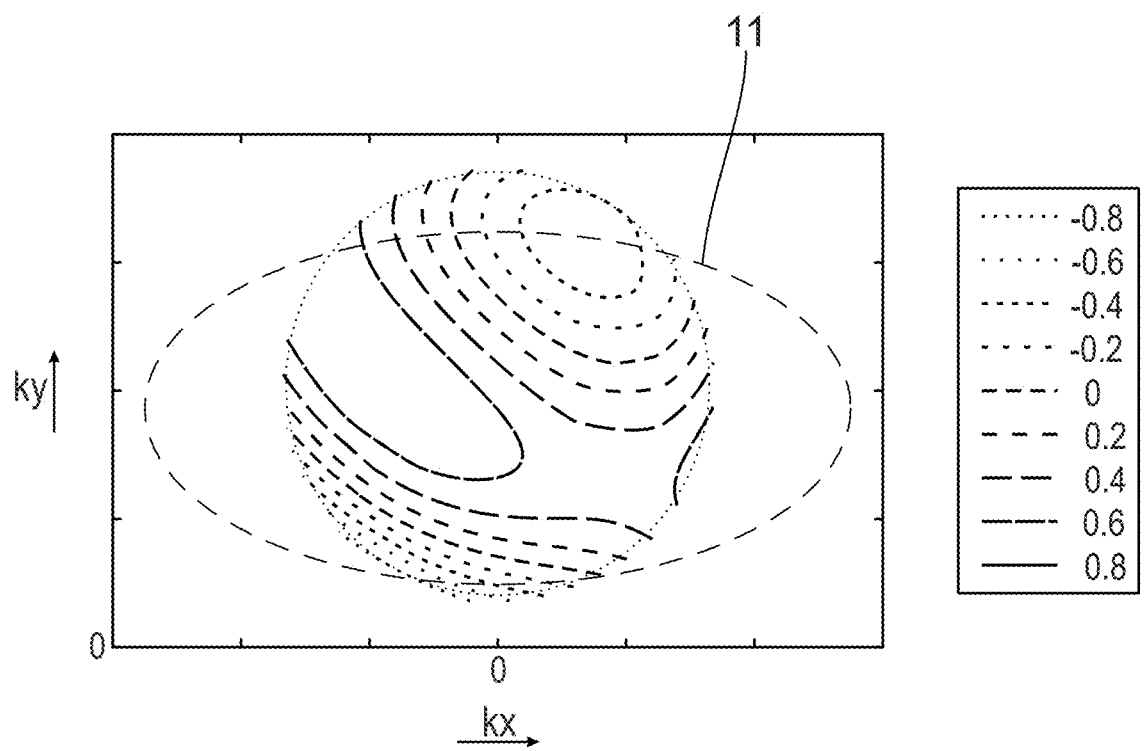
Figure 10:
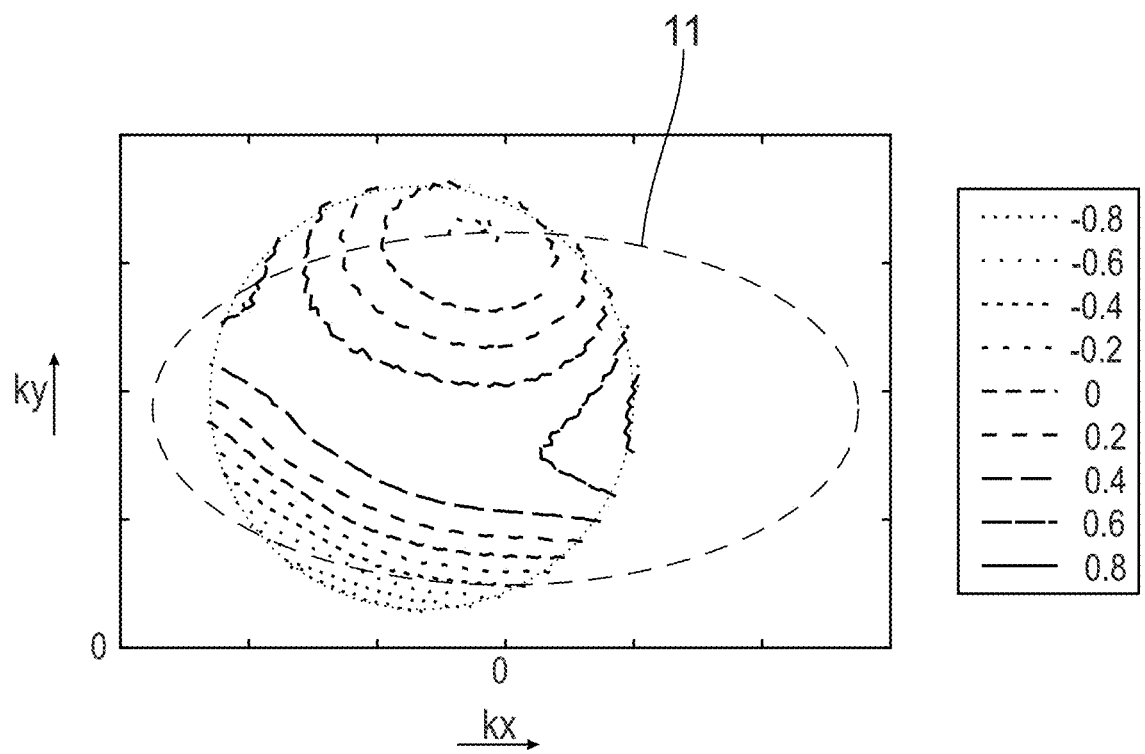

In a view that corresponds to a meridional section, FIG. 1 shows a beam path of EUV illumination light or imaging light 1 in a metrology system 2 for determining an imaging quality of an optical system when illuminated by the illumination light 1 within an entrance pupil 11 to be measured. In this case, a test structure 5 (cf., FIG. 2) in the form of a reticle or a lithography mask arranged in an object field 3 in an object plane 4 is imaged using the EUV illumination light 1. Below, the test structure 5 is also referred to as object or sample. The metrology system 2 is used to analyze a three-dimensional (3-D) aerial image (aerial image metrology system). Applications include the reproduction of an aerial image of a lithography mask, as the aerial image would also look like in a producing projection exposure apparatus, for example in a scanner. To this end, it can be desirable to measure and optionally adjust an imaging quality of the metrology system 2 itself. Consequently, the analysis of the aerial image can serve to determine the imaging quality of a projection optical unit of the metrology system 2, or else to determine the imaging quality of, for example, projection optical units within a projection exposure apparatus. Such systems are known from WO 2016/012 426 A1, from US 2013/0063716 A1 (cf., FIG. 3 therein), from DE 102 20 815 A1 (cf., FIG. 9 therein), from DE 102 20 816 A1 (cf., FIG. 2 therein) and from US 2013/0083321 A1.

The illumination light 1 is reflected at the object 5. A plane of incidence of the illumination light 1 is parallel to the yz-plane in the case of central illumination (kx=0, cf., the following description, for example in relation to FIG. 4).

The EUV illumination light 1 is produced by an EUV light source 6. The light source 6 can be a laser plasma source (LPP; laser produced plasma) or a discharge source (DPP; discharge produced plasma). In principle, a synchrotron-based light source may also be used, for example a free electron laser (FEL). A used wavelength of the EUV light source may range between 5 nm and 30 nm. In principle, in the case of a variant of the metrology system 2, a light source for another used light wavelength may also be used instead of the light source 6, for example a light source for a used wavelength of 193 nm.

Depending on the embodiment of the metrology system 2, the latter can be used for a reflective or else for a transmissive object 5. One example of a transmissive object is a pinhole aperture.

An illumination optical unit 7 of the metrology system 2 is arranged between the light source 6 and the object 5. The illumination optical unit 7 serves for the illumination of the object 5 to be examined with a defined illumination intensity distribution over the object field 3 and at the same time with a defined illumination angle distribution with which the field points of the object field 3 are illuminated. This illumination angle distribution is also referred to hereinafter as illumination subaperture.

The illumination subaperture is delimited by way of a sigma subaperture stop 8 of the illumination optical unit 7, which is arranged in an illumination optical unit pupil plane 9. Alternatively or in addition, a corresponding subaperture stop may also be present in the imaging optical unit of the metrology system 2, which is yet to be described below. The sigma subaperture stop 8 restricts a beam of illumination light 1 which is incident thereon on the edge. Alternatively or in addition, the sigma subaperture stop 8 and/or the stop in the imaging optical unit can also shadow the illumination light beam from the inside, that is to say act as an obscuration stop. A corresponding stop can have an inner stop body that accordingly shadows the beam on the inside, the stop body being connected to an outer stop support body by way of a plurality of webs, for example by way of four webs.

The sigma subaperture stop 8 is displaceable by way of a displacement drive 8a in the illumination optical unit pupil plane 9, that is to say parallel to the xy-plane, in a defined fashion.

Figure 4:
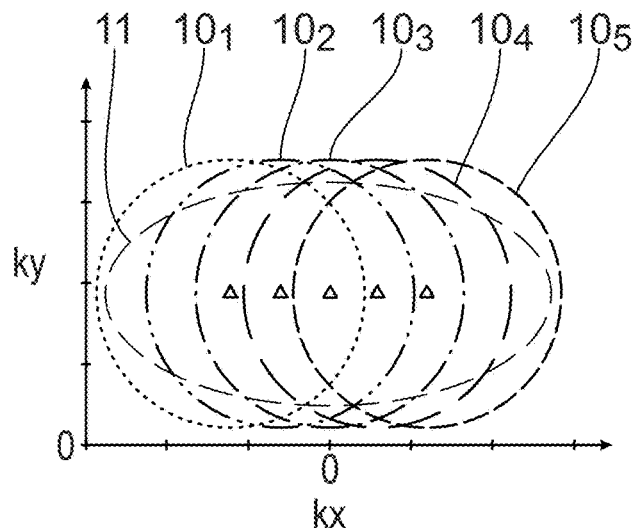
FIG. 4 shows an entrance pupil to be measured of the optical system to be measured, the entrance pupil being embodied as an elliptical entrance pupil, together with a set of subapertures, each embodied as a subpupil with a circular edge, for the one-line scan of the entrance pupil to be measured, with each of the subapertures corresponding to a specified illumination angle distribution for illuminating the test structure with the illumination light, with the test structure being illuminated sequentially with an illumination angle distribution corresponding to a superposition of all subapertures.

FIG. 4 shows a plurality of such subapertures $10_i$ (i=1 to 5) which scan an elliptical entrance pupil 11 to be measured of the optical system to be measured. The elliptical entrance pupil 11 has a ratio between the major semiaxis parallel to the x axis and the minor semiaxis parallel to they axis of 2:1. Other axis ratios of the elliptical edge contour 10 in the range from 10:1 to 1.1:1 are also possible, for example of 1.5:1, 1.6:1, 2.5:1, 3:1, 4:1, 5:1 or 8:1.

After reflection at the object 5, the illumination and imaging light 1 enters an imaging optical unit or projection optical unit 13 of the metrology system 2. In a manner analogous to the illumination subaperture, there is a projection optical unit subaperture which is specified by an NA subaperture stop 11a in the entrance pupil 11 of the projection optical unit 13 in FIG. 1. The NA subaperture stop 11a is displaceable by way of a displacement drive 11b in the projection optical unit pupil plane 11, that is to say parallel to the xy-plane, in a defined fashion. Typically, the sigma subaperture stop and the NA subaperture stop are aligned in such a way relative to one another that both stops are struck centrally by a central light ray of the illumination light 1 and the reflection at the test structure 5. The sigma subaperture stop and the NA subaperture stop can be centered relative to one another. The region of the entrance pupil 11 of the projection optical unit 13 defined by the NA subaperture stop is referred to as subaperture.

The imaging optical unit 13 to be measured serves for imaging the object 5 towards a spatially resolving detection device 14 of the metrology system 2. The detection device 14 is designed for example as a CCD detector. A CMOS detector can also be used. The detection device 14 is arranged in an image plane 15 of the projection optical unit 13.

The detection device 14 is signal connected to a digital image processing device 17. A pixel spatial resolution of the detection device 14 in the xy-plane can be specified in such a way that it is inversely proportional to the numerical aperture of the entrance pupil 11 to be measured, in the coordinate directions x and y ($NA_x$, $NA_y$). In the direction of the x-coordinate, this pixel spatial resolution is regularly less than $\lambda/2NA_x$, and, in the direction of the y-coordinate, it is regularly less than $\lambda/2NA_y$. In this case, $\lambda$ is the wavelength of the illumination light 1. The pixel spatial resolution of the detection device 14 can also be implemented with square pixel dimensions, independently of $NA_x$, $NA_y$.

A spatial resolution of the detection device 14 can be increased or reduced by resampling. A detection device with pixels with different dimensions in the x- and y-direction is also possible.

The object 5 is carried by an object holder or a holder 18. The holder 18 can be displaced by a displacement drive 19 on the one hand parallel to the xy plane and on the other hand perpendicularly to this plane, that is to say in the z direction. The displacement drive 19, as also the entire operation of the metrology system 2, is controlled by a central control device 20, which, in a way that is not represented any more specifically, is in signaling connection with the components to be controlled.

The optical set-up of the metrology system 2 serves for the most exact possible emulation of an illumination and an imaging in the course of a projection exposure of the object 5 during the projection-lithographic production of semiconductor components.

FIG. 1 shows various possible arrangement planes of the test structure 5 in the region of the object plane 4, in each case using a dashed line. During the operation of the metrology system 2, the test structure 5 is illuminated at different distance positions $z_m$ of the test structure 5 relative to the object plane 4 using the illumination angle distribution respectively specified by the subaperture $10_i$, and an intensity $I(x, y, z_m)$ is recorded in spatially resolved fashion in the image plane 15 for the respective distance position $z_m$. This measurement result $I(x, y, z_m)$ is also referred to as an aerial image.

The number of focal planes $z_m$ can be between two and twenty, for example between ten and fifteen. In this case, there is a total displacement in the z-direction over several Rayleigh units ($NA/\lambda^2$).

Depicted in FIG. 1 as an insert is a xy-plan view of the test structure 5, which may be in the form of a round or an elliptical test structure.

In addition to the entrance pupil 11, FIG. 1 also still schematically represents an exit pupil 21 of the projection optical unit 13.

FIG. 1, bottom, shows three measurement results of the detection device 14, once again in a xy-plan view, with the central measurement result showing the image representation of the test structure 5 in the case of an arrangement in the object plane 4 and the other two measurement results showing the image representations in which the test structure 5 has been displaced in comparison with the z-coordinate of the object plane 4, once in the positive z-direction and once in the negative z-direction. An aerial image of the test structure 5 arises from the totality of the measurement results assigned to the respective z-coordinates.

Figure 2:
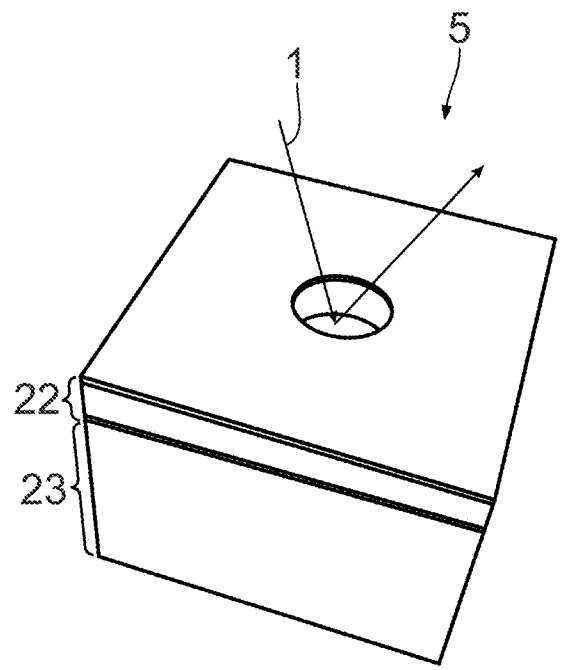
FIG. 2 shows a test structure in the form of an EUV pinhole for use as a reflective object to be imaged in the metrology system according to FIG. 1, in a perspective and magnified fashion.

FIG. 2 shows details of the test structure 5, which is embodied as a reflective pinhole. The course of a chief ray of the illumination light 1 upon reflection at the test structure 5 is depicted schematically. A chief ray angle of incidence of the illumination light 1 on the pinhole of the test structure 5 ranges between 3° and 8°, for example 5° or 6°. The pinhole of the test structure 5 has a diameter ranging between 100 nm and 150 nm. The pinhole is formed in an absorber layer 22 which in turn is applied to a highly reflective multilayer layer 23. The absorber layer has a thickness ranging between 50 nm and 70 nm. The multilayer layer has a thickness ranging between 250 nm and 300 nm.

The pinhole of the test structure 5 may be elliptical. The principal axes of the pinhole can have approximately the same size as the Airy disk of the projection optical unit 13, that is to say $2.44\lambda/NA_x$ in the direction of the x-coordinate and $2.44\lambda/NA_y$ in the direction of the y-coordinate.

The test structure 5 may have a single pinhole or else a plurality of pinholes, such as a periodic array of pinholes. Other test structures are possible, for example as described in US 2015/0355052 A1.

Figure 3:
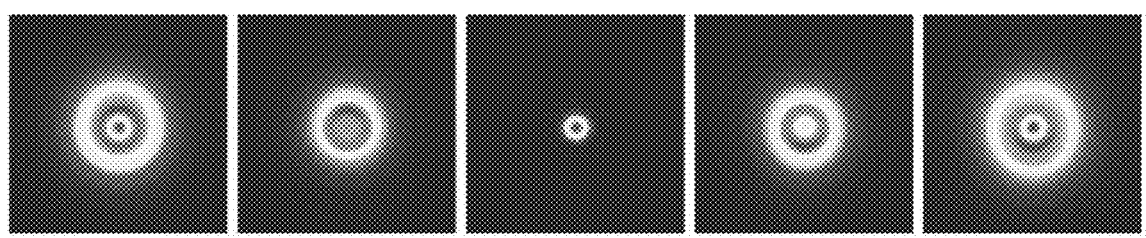
FIG. 3 shows results of an intensity measurement in an image plane of the imaging optical unit of the metrology system when imaging the test structure according to FIG. 2, for different positions of an arrangement plane of the test structure relative to an object plane (z-focus stack)

FIG. 3 shows a result $I(x, y, z_m)$ as a sequence of five measurements with different z-coordinate of the test structure 5, with the middle measurement of the five having emerged with an arrangement of the test structure in the object plane 4. Thus, measurement results of the detection device 14 are once again depicted. A comparison of the measurement depicted in FIG. 3, far left, with the measurement depicted in FIG. 3, far right, shows an asymmetry of the imaging measurement results when imaging the round pinhole of the test structure 5, which can be traced back to the oblique illumination of the test structure 5 by the illumination light 1. This yields an illumination angle-dependent test structure contribution to an influence on the wavefront by the test structure 5.

FIG. 4 shows an embodiment of a single-line scan of the entrance pupil 11 of the projection optical unit 13 to be measured, using the subapertures $10_1$ to $10_5$ which are specified by way of the subapertures stops 8 and 11a of the illumination optical unit 7 and the projection optical unit 13.

These pupils are represented in angle space, that is to say in the pupil coordinates kx (corresponding to the x spatial coordinate) and ky (corresponding to the y spatial coordinate). On account of the oblique illumination, a center of the entrance pupil 11 is at kx=0 and at ky≠0. The centers of the various subapertures $10_i$, that is to say the relative position of the respective chief rays, are labeled by triangles in FIG. 4. These centers of adjacent subapertures $10_i$, $10_{i+1}$ are shifted with respect to one another by a constant increment in the kx-direction. The centers of the subapertures $10_i$ each have the same ky-coordinate. An envelope of all subapertures $10_i$ covers, in its entirety, the entrance pupil 11 to be measured. A center of the elliptical entrance pupil 11 is at (kx=0, ky=0.1). The center of the subaperture $10_3$ coincides with the center of the elliptical entrance pupil 11 to be measured.

Figure 5:
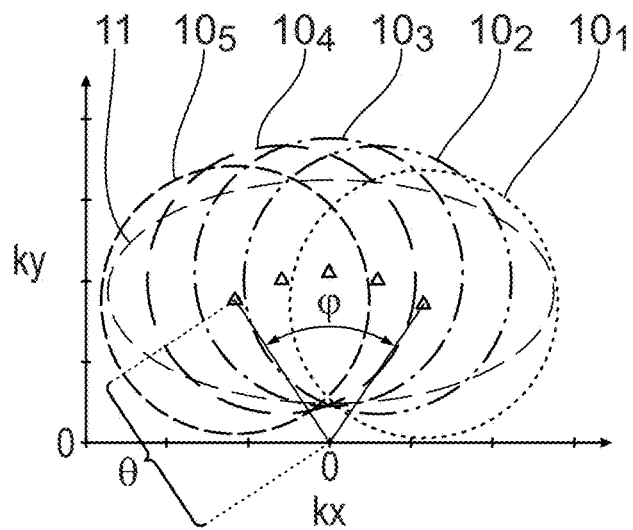
FIG. 5 shows, in a representation similar to FIG. 4, a variant of a scan of the entrance pupil to be measured using subapertures, the scan being implemented such that a chief ray polar angle of the illumination of the test structure remains constant for all subapertures.

FIG. 5 shows a variant of a scan of the entrance pupil 11 to be measured, using the subs apertures $10_i$. Once again, a scan with five subapertures $10_1$ to $10_5$ is depicted. The scan according to FIG. 5 is such that a chief ray polar angle θ between the origin (kx=0, ky=0) of the pupil plane 9 and the centers of the subapertures $10_i$ remains constant in each case. In (kx, ky)-space, the chief ray polar angle θ has an absolute value of slightly more than 0.1. This chief ray polar angle θ is measured between the origin 0,0 of the pupil plane 9 and the respective center of the subaperture $10_i$. In the scan according to FIG. 5, the subapertures $10_i$ thus are shifted in relation to one another in such a way that the chief ray polar angle θ of the respective subaperture remains constant.

When the entrance pupil 11 is scanned, the subapertures $10_1$ to $10_5$ sweep over a chief ray is azimuth angle φ which is approximately 75° in the embodiment according to FIG. 5.

Figure 6:
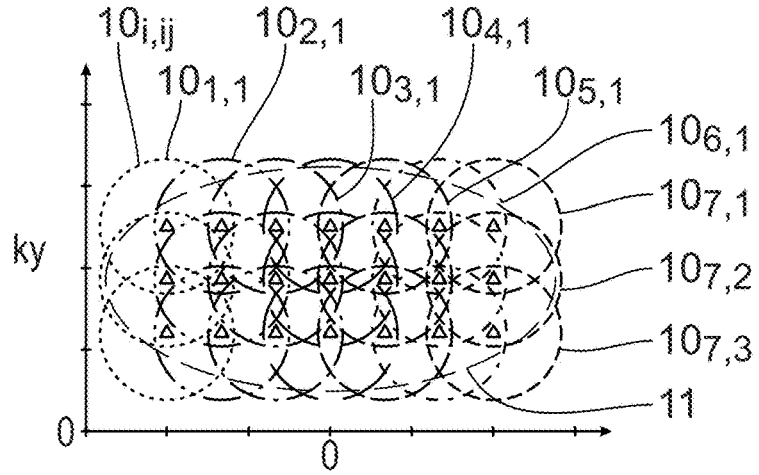
FIG. 6 shows, in a representation similar to FIGS. 4 and 5, a further variant of a multi-line Cartesian scan of the entrance pupil to be measured using subapertures.

FIG. 6 shows a further variant of a scan of the elliptical entrance pupil 11 to be measured, using subapertures $10_{i,j}$. In this case, i specifies the line number and j specifies the column number of the respective subaperture $10_{i,j}$. The scan according to FIG. 6 is implemented using a total of twenty-one subapertures $10_{i,j}$ in three lines (i=3) and seven columns (j=7).

As an alternative to a single-line scan with a constant chief ray polar angle θ like in the variant according to FIG. 5, there could also be a multi-line scan in which the respective chief ray polar angle $θ_i$ remains constant in each line, with the chief ray polar angles $θ_i$, $θ_{i+1}$ of the various lines i, i+1 being different from one another in each case.

Figure 11:
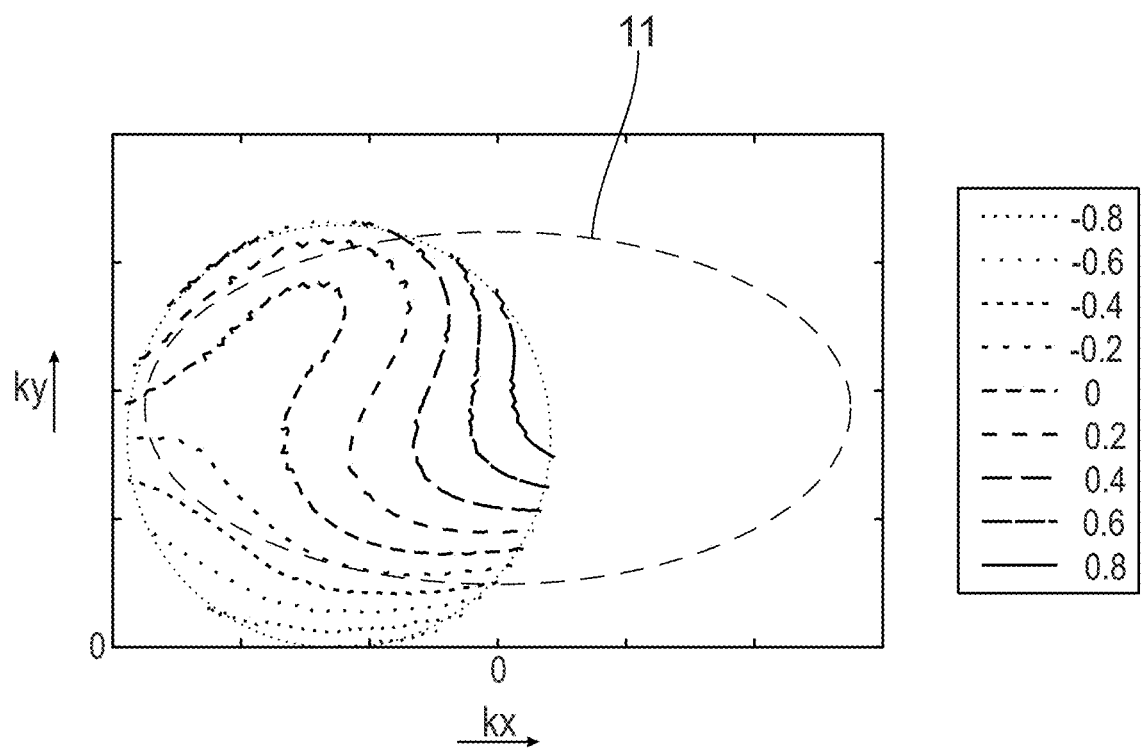
Figure 12:
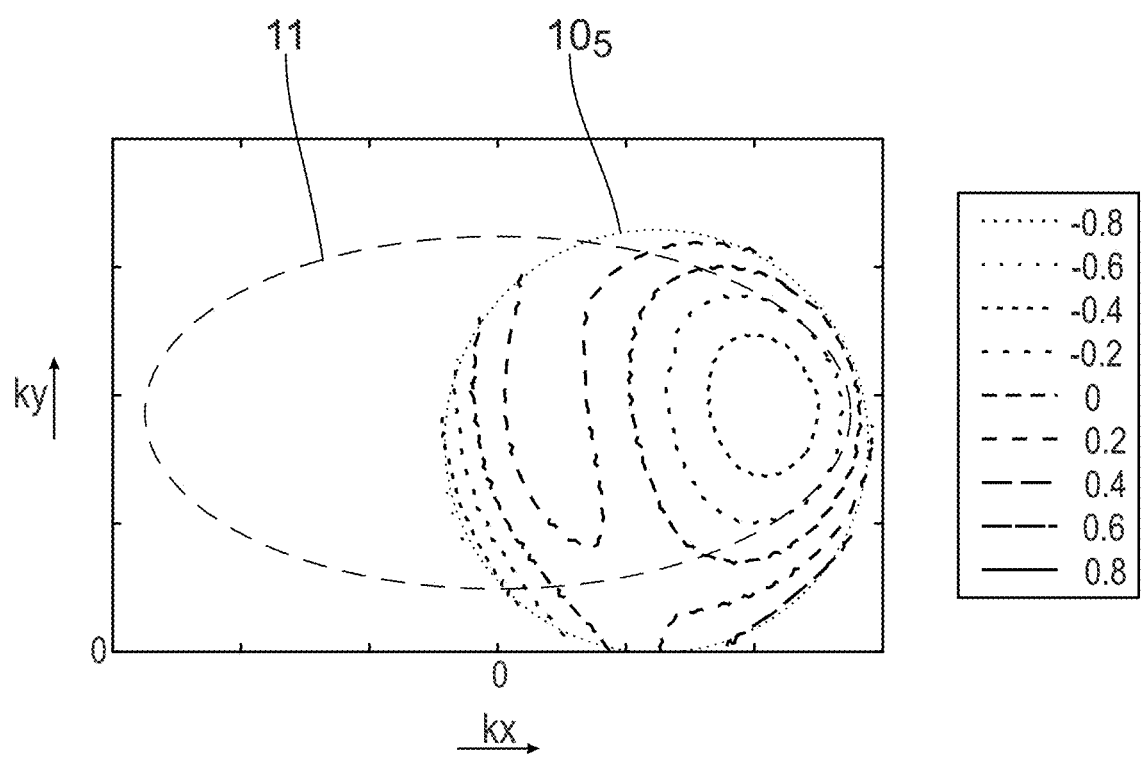
FIGS. 12 to 16 show separated test structure contributions to the wavefront measurement results according to FIGS. 7 to 11, once again represented in each case using a contour line diagram.
Figure 13:
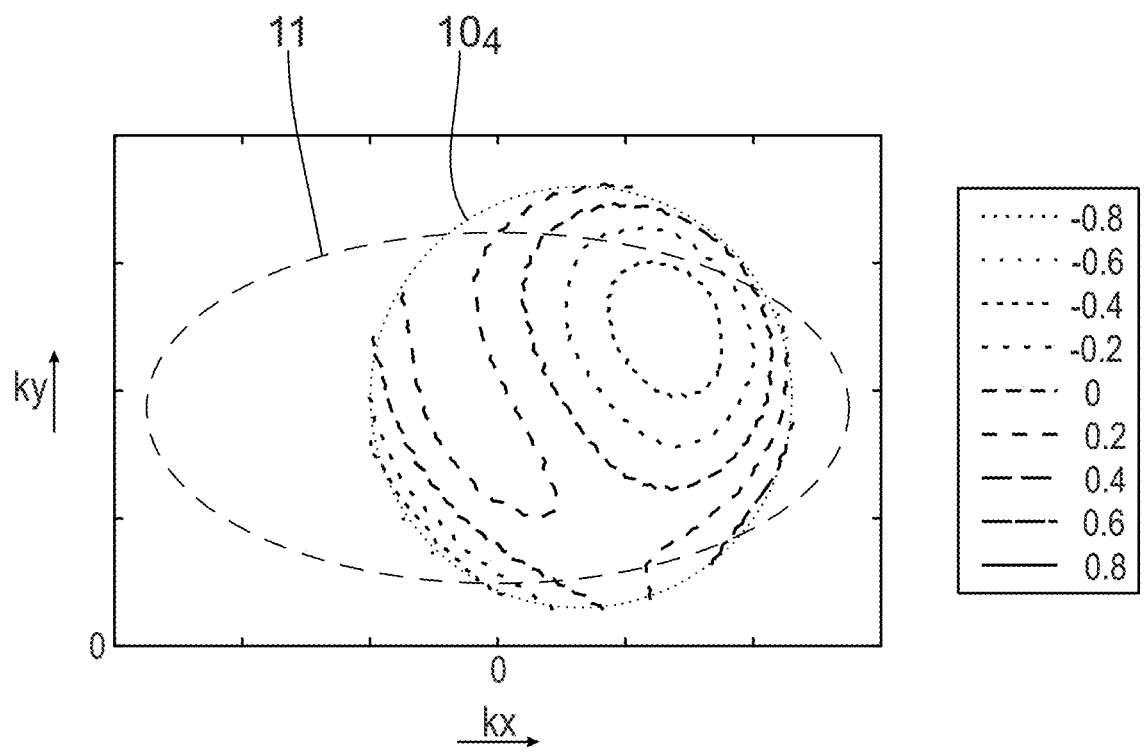
Figure 14:
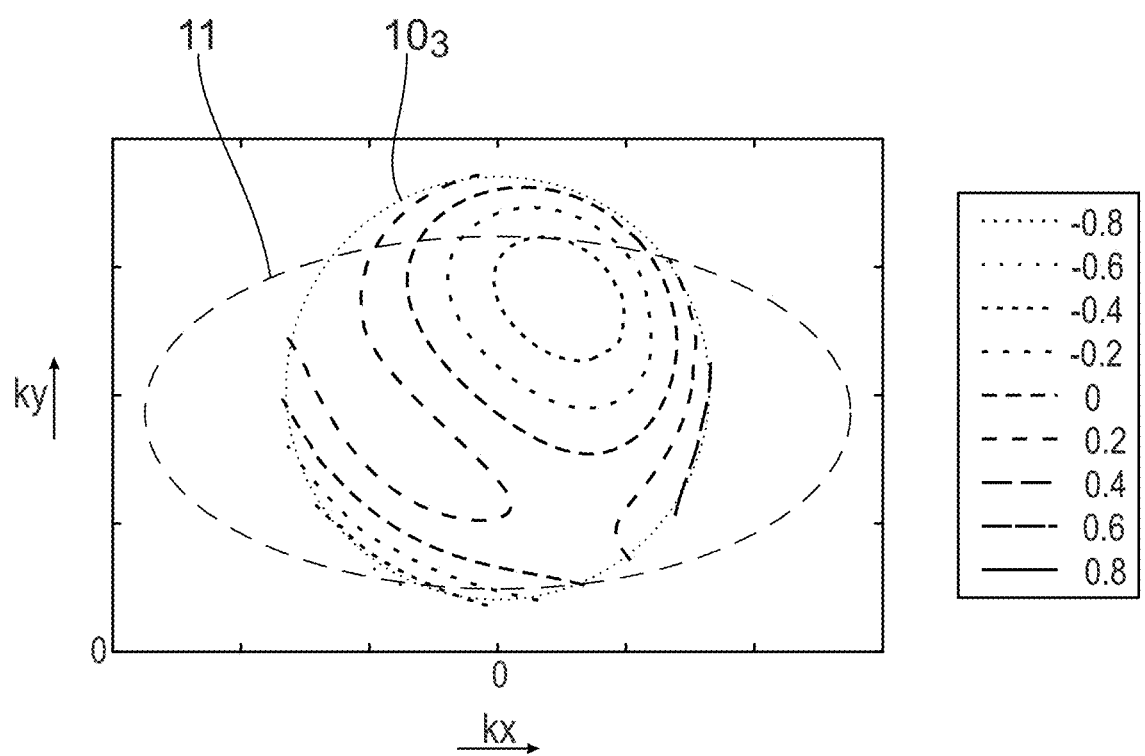
Figure 15:
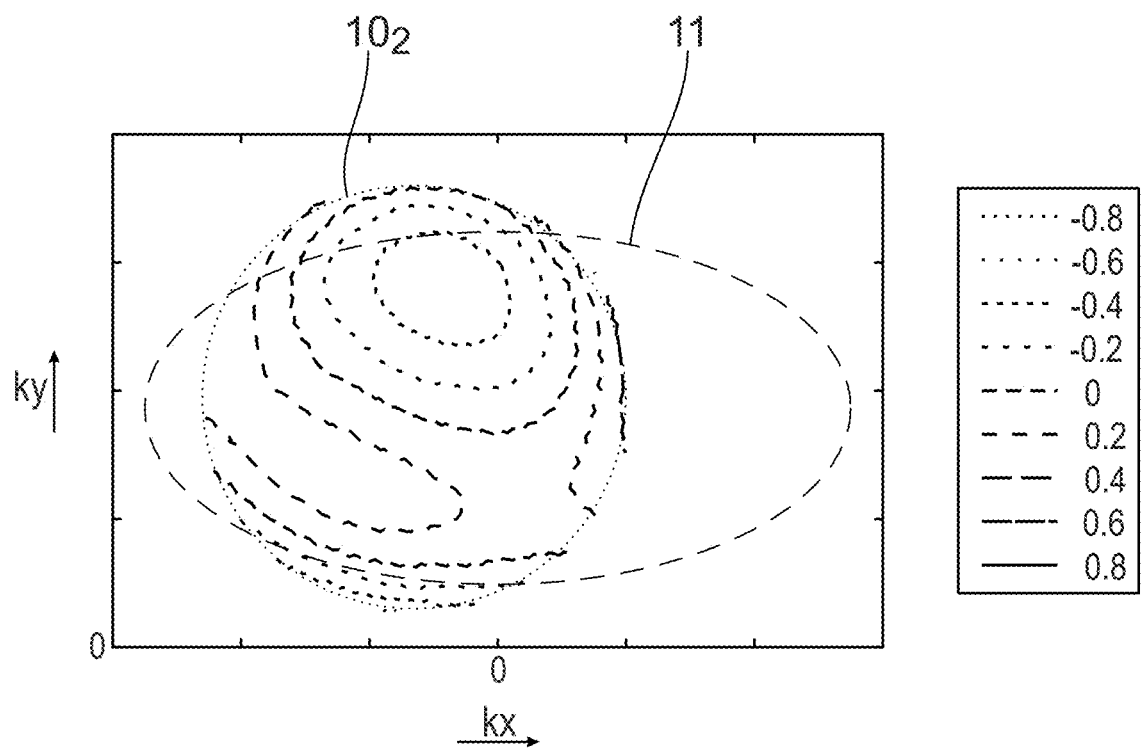
Figure 16:
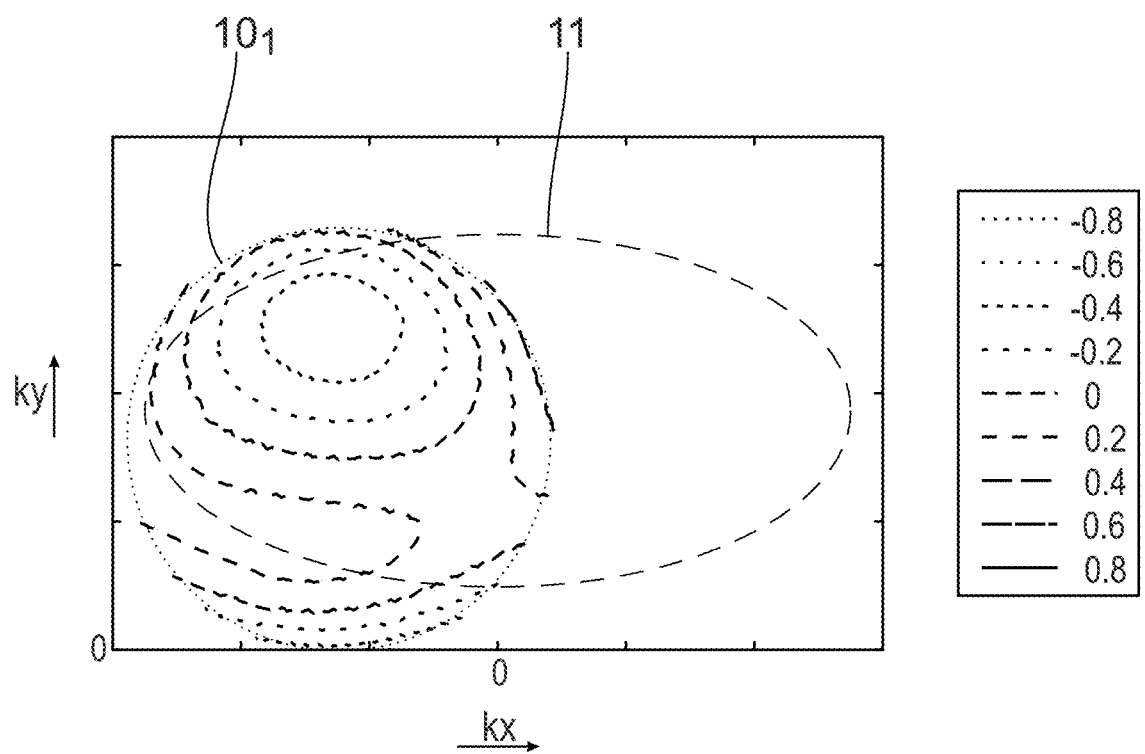
Figure 17:
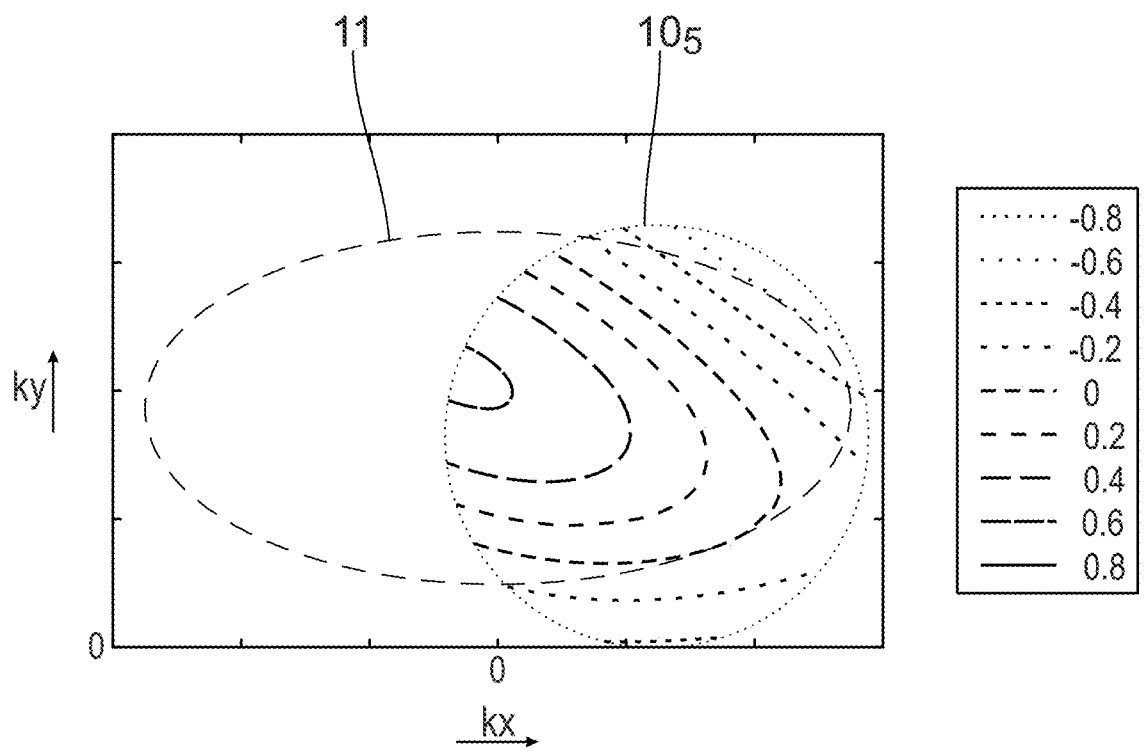
FIGS. 17 to 21 show wavefront measurement results in sections of the entrance pupil to be measured corresponding to the subapertures according to FIGS. 7 to 11 after subtraction of the test structure contributions according to FIGS. 12 to 16 from the original wavefront measurement results according to FIGS. 7 to 11, that is to say after the elimination of the test structure contributions, once again represented in each case using a contour line diagram.
Figure 18:
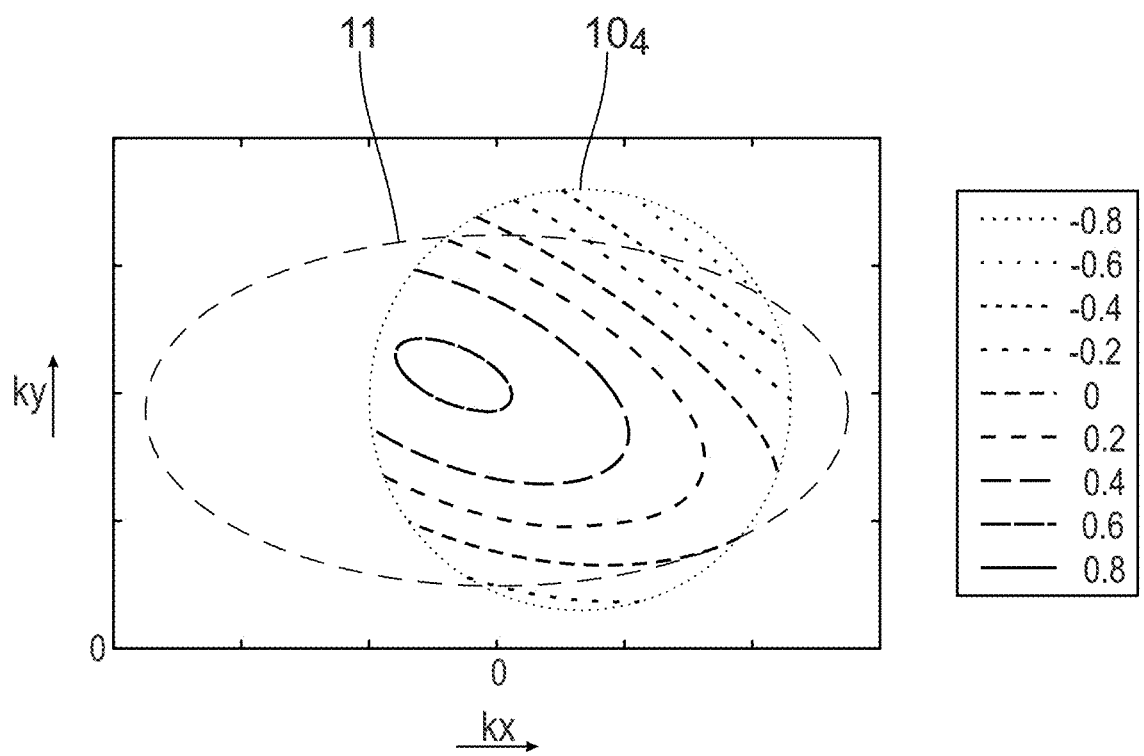
Figure 19:
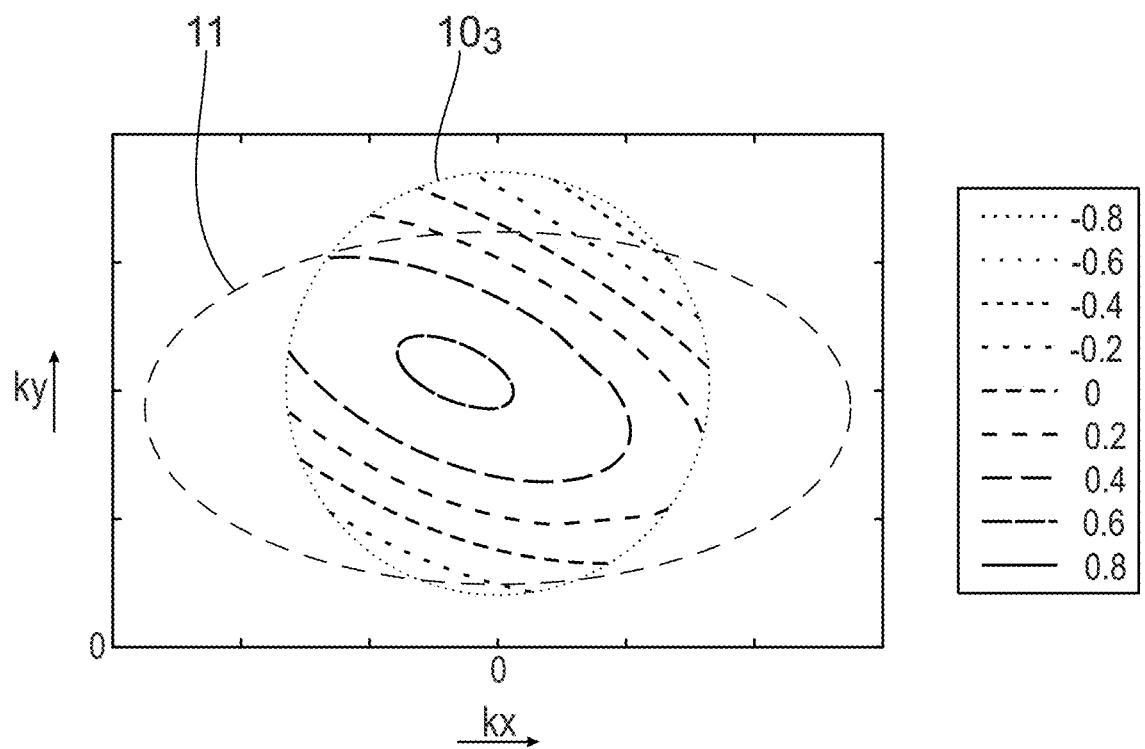
Figure 20:
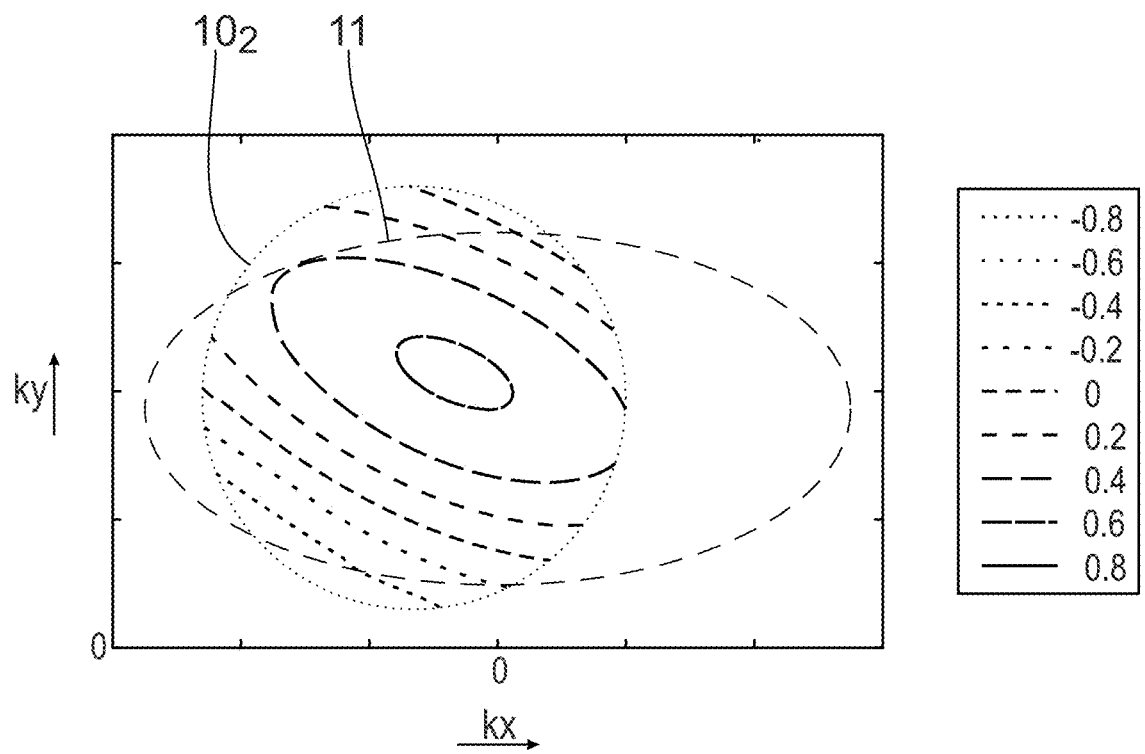
Figure 21:
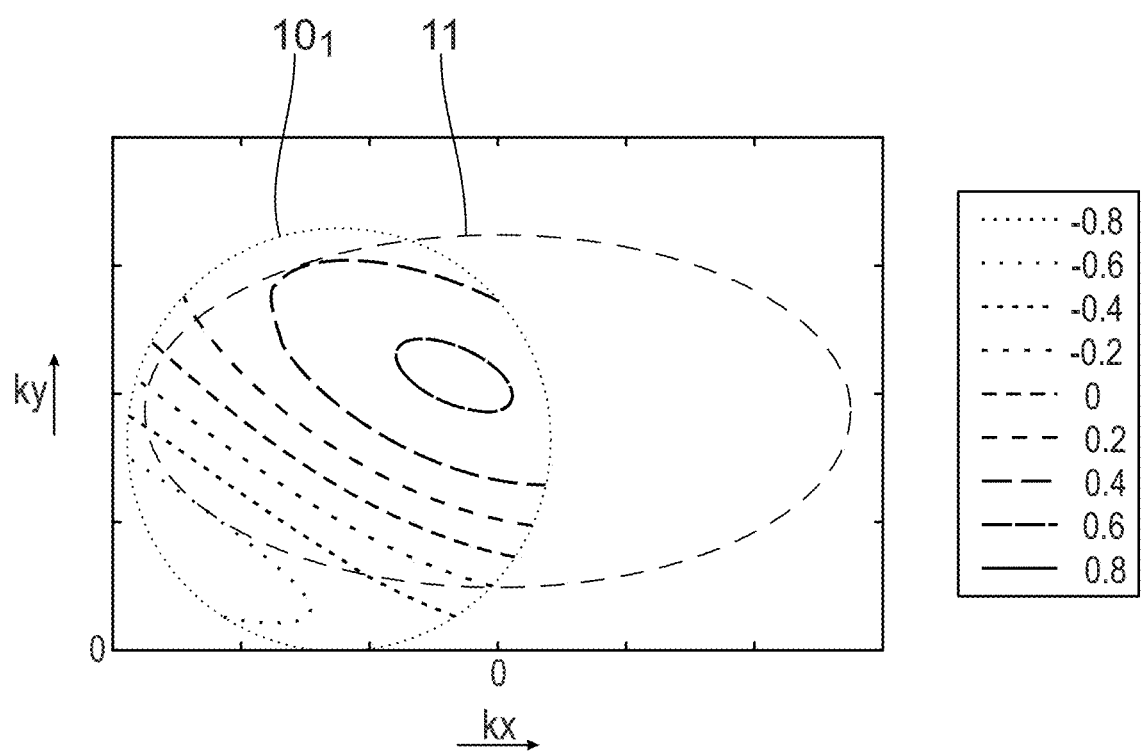

In the form of contour line diagrams, FIGS. 7 to 11 show results of a wavefront measurement on the basis of a use of the subapertures $10_5$ (FIG. 7), $10_4$ (FIG. 8), $10_3$ (FIG. 9), $10_2$ (FIG. 10) and $10_1$ (FIG. 11). In this case, a measurement was carried out via the scanning according to FIG. 5 with the constant chief ray polar angle. To the right next to the respective wavefront representation there is a legend for the relative phase values which correspond to the respective contour line.

Figure 7:
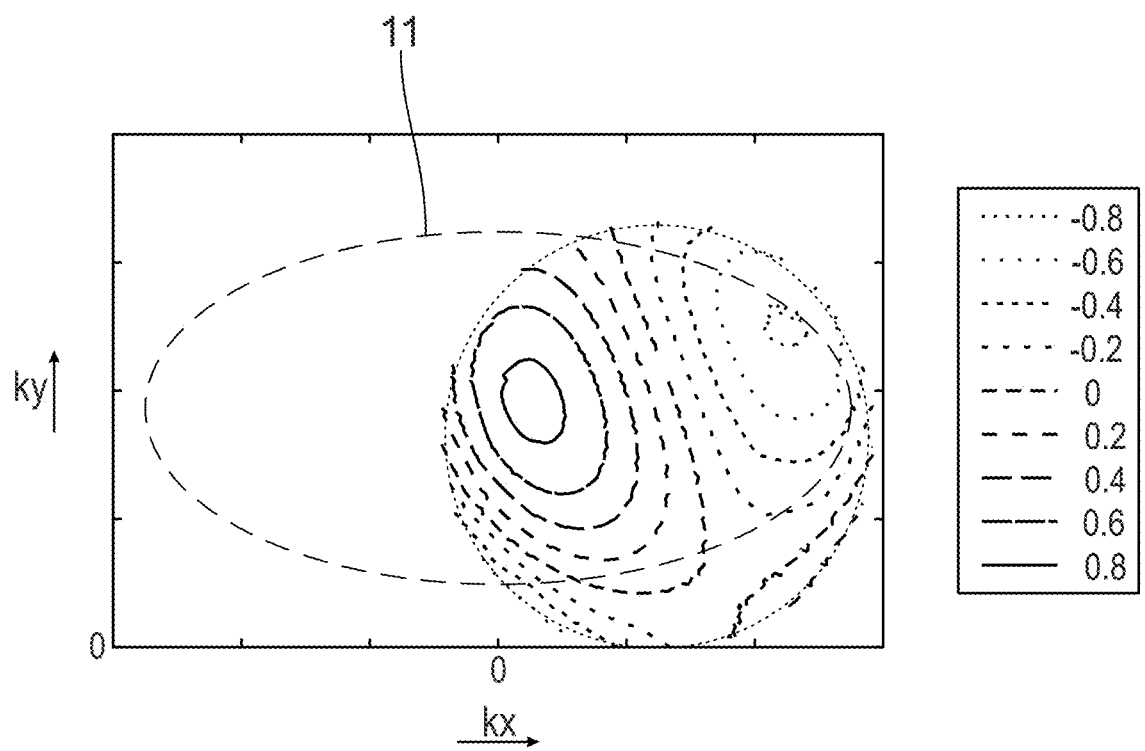
FIGS. 7 to 11 show wavefront measurement results in a contour line diagram, in each case represented as phase contributions in a pupil plane of the imaging optical unit, for five selected sub apertures of a scan according to FIG. 5.
Figure 8:
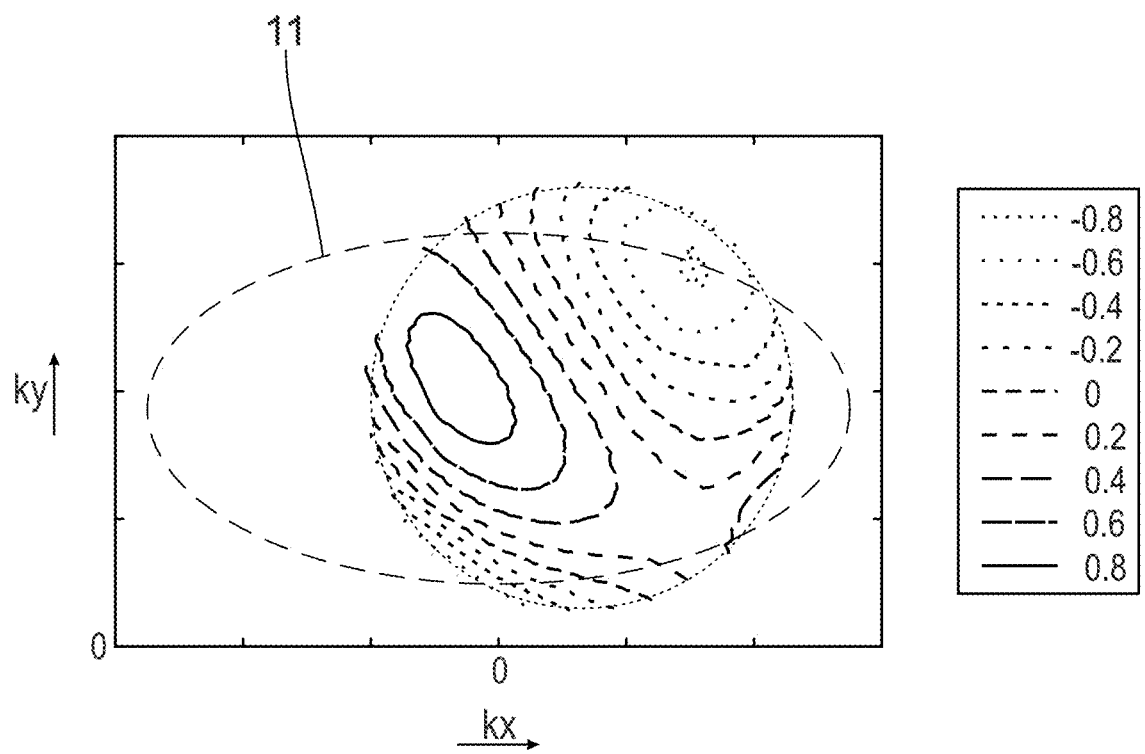

FIG. 7 depicts a phase of a wavefront which was determined from the measurement results of the focus stack for the respectively set subaperture $10_i$. This determination of the phase contribution according to FIGS. 7 to 11 is implemented with the aid of a phase retrieval method, which is known from DE 10 2013 219 524 B4.

In representations similar to FIGS. 7 to 11, FIGS. 12 to 16 in turn show the phases of a test structure contribution to an influence on the wavefront of the illumination light 1 by the test structure 5. In each case, this test structure contribution can be separated and eliminated from the measurement result according to FIGS. 7 to 11. What is exploited here, inter alia, is that the test structure contribution during the illumination with the respective subaperture $10_5$ (FIG. 12) to $10_1$ (FIG. 16) remains constant in respect of the is phase distribution, with only an orientation of this phase distribution changing in accordance with the rotation of the chief ray azimuth angle φ. A "pole" 24 of smallest phase values of the test structure contribution points approximately to the right in FIG. 12 and approximately to the top in FIG. 16, corresponding to the chief ray azimuth angle φ changed by approximately 75°.

The test structure contribution according to FIGS. 12 to 16 can be determined independently of the wavefront measurement according to FIGS. 7 to 11.

FIGS. 17 to 21 show, once again in a representation similar to FIGS. 7 to 11, the result of the wavefront measurement for the respective subaperture $10_5$ (FIG. 17) to $10_1$ (FIG. 21) after the elimination of the test structure contribution according to FIGS. 12 to 16. The wavefront phase contribution measured or determined by way of the respective subaperture $10_5$ to $10_1$ during the measurement according to FIGS. 17 to 21 is bounded by way of a circular edge depicted using dots and, moreover, there is a depiction of the wavefront phase of the optical system to be measured within the pupil plane of the respective subaperture $10_i$.

In a representation similar to FIGS. 17 to 21, FIG. 22 shows the superposition of the subaperture determination results according to FIGS. 17 to 21, that is to say the entire determined wavefront component in the pupil plane of the optical system to be measured.

Figure 22:
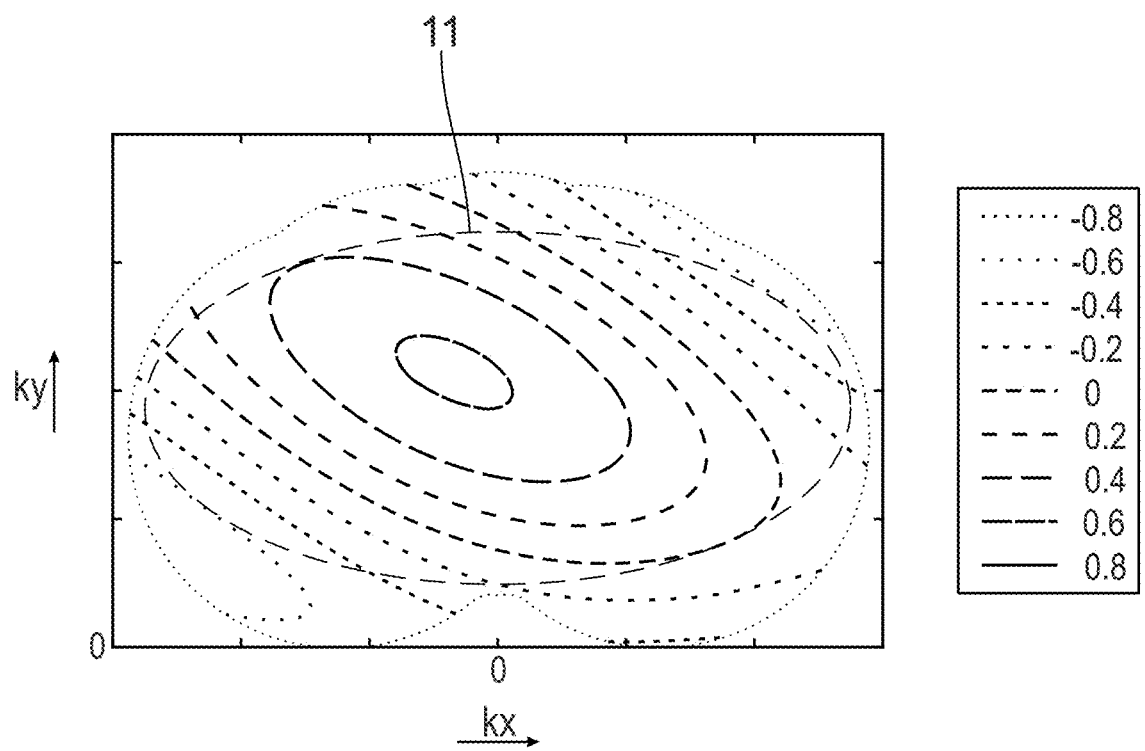
FIG. 22 shows a superposition of the subaperture contributions of the wavefront measurement results according to FIGS. 17 to 21.
Figure 23:
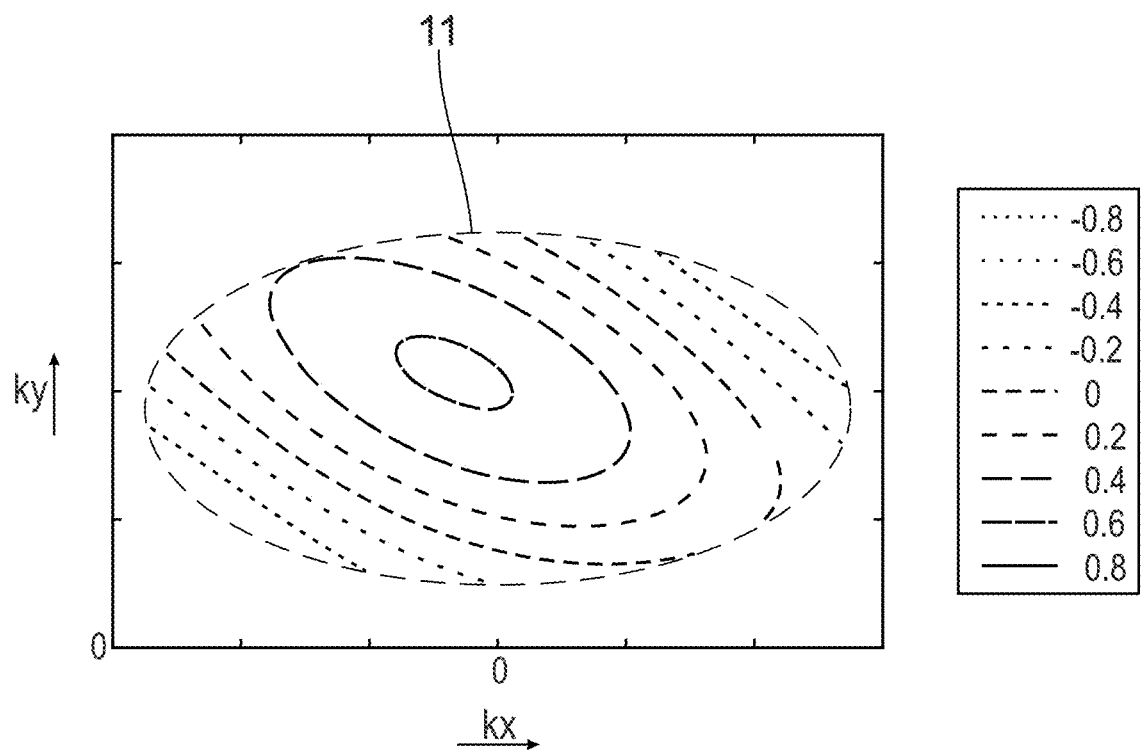
FIG. 23 shows a restriction of the wavefront measurement results according to FIG. 22 to the entrance pupil to be measured, that is to say the phase of the wavefront of the optical system to be measured within the entrance pupil to be measured.

FIG. 23 shows the restriction of the determination result according to FIG. 22 to the elliptical entrance pupil 11 to be measured.

When determining the wavefront measurement data according to FIG. 23 from the original measurement data according to FIGS. 7 to 11 and the test structure contributions according to FIGS. 12 to 16, use is made of a shift-rotation method.

Examples of such a shift-rotation method can be found for example in the specialist article by D. Su et al. Absolute surface figure testing by shift-rotation method using Zernike polynomials. Optics Letters Vol. 37, No. 15, 3198-3200, 2012. https://doi.org/10.1364/OL.37.003198 and DE 10 2013 226 668 A1.

If the measurement data (m pixel values) of all n (n=5 in the depicted example) subapertures are combined as a vector, the following system of equations can be constructed:

$$M = T \cdot \begin{pmatrix} W \\ P \end{pmatrix} \quad (1)$$

$$M = \begin{pmatrix} M_{11} \\ \vdots \\ M_{m1} \\ \vdots \\ M_{1n} \\ \vdots \\ M_{mn} \end{pmatrix}$$

measurement data of the wavefront measurement (cf., above, FIGS. 7 to 11), n subapertures each with m wavefront points, that is to say m pixels within the pupil plane as the result of the wavefront measurement evaluated on a pixel grid;

$$W = \begin{pmatrix} W_1 \\ \vdots \\ W_q \end{pmatrix}$$

: wavefront points to be determined of the projection optical unit 13 (cf., above, FIGS. 17 to 21), typically q>m (superposition of the results according to FIGS. 7 to 11; cf., FIGS. 22 and 23), the index q running over all points that are covered by at least one subaperture $10_i$ (i=1 to n);

$$P = \begin{pmatrix} P_1 \\ \vdots \\ P_m \end{pmatrix}$$

: pinhole contribution (cf., FIGS. 12 to 16), m wavefront points;

$$T = \begin{pmatrix} T_{W_1} & T_{P_1} \\ \vdots & \vdots \\ T_{W_n} & T_{P_n} \end{pmatrix}$$

: combined transformation matrix;
$T_{W_i}$: m×q optics transformation matrix, subaperture i
$T_{P_i}$: m×m pinhole transformation matrix, subaperture i For a subaperture scan according to FIG. 4 above, $\{T_{P_i}\}$ are given by the m×m identity matrices $I_m$ if the contribution of the pinhole is independent of kx. Should the pinhole contribution depend on kx, this dependence is modeled by a suitable choice of the transformation matrices $\{T_{P_i}\}$.

In the case of a subaperture scan according to FIG. 5 above, the matrices correspond to a rotation of the wavefront points. If the wavefronts are described on a Cartesian grid, the rotation usually involves an interpolation of the pixel values. In this case, both a "nearest neighbor" interpolation and a linear (or higher order) interpolation are possible and are modeled accordingly in $\{T_{P_i}\}$.

The system of equations $$M = T \cdot \begin{pmatrix} W \\ P \end{pmatrix}$$

can be solved using conventional methods for solving linear systems of equations and the wavefront aberration W to be measured of the projection optical unit and the component of the wavefront aberrations P caused by the pinhole can be determined in this way.

Zernike polynomials can be fitted to the determined wavefront aberrations W of the projection optical unit in the region of the elliptical pupil to be measured and of the pinhole P, and hence it is possible to determine the Zernike spectrum.

The method from the application example can also be used to improve the wavefront measurement on a round, circular entrance pupil of an optical unit to be measured, rather than on the elliptical entrance pupil 11, since the contributions of the pinhole and the projection optical unit can be separated.

In phase retrieval, the measured aerial image I(x, y, $z_m$) is compared with a simulated aerial image $I_{sim}$ and fit parameters of a function set for describing the simulated aerial image are adapted until a difference between the measured aerial image and the simulated aerial image has been minimized.

The wavefront of the optical system is determined within the phase retrieval on the basis of the minimized difference between the measured and the simulated aerial image.

The phase retrieval difference minimization can be optimized with the aid of various methods. These include projection methods which are also known as error reduction algorithms, Gerchberg-Saxton methods or IFTA methods. The use of conventional iterative optimization methods is also possible. By way of example, such methods include gradient descent, least square, damped least square, genetic search method, simplex method, Chambolle-Pock optimization, back propagation method. Direct inversion methods can also be used. Examples thereof include extended Nijbour Zernike decomposition or else a machine learning-based method on the basis of, for example, previous results stored in a database. If aberrations of the optical system are expected as a matter of principle within the entrance pupil to be measured, a sufficiently densely sampled database can be generated via simulation. The retrieval can then be implemented via the search in this database. Within the scope of machine learning, a network can be trained with the aid of a precalculated aberration data set.

For the parametric capture and determination of the imaging aberrations of the optical system, a description of these imaging aberrations, that is to say for example a description of the phase distribution according to FIG. 23, can be decomposed into basis functions. Such an optimization via basis functions avoids unwanted result noise.

What is important for an accurate determination of the imaging quality is that the basis functions are able to describe the expected imaging aberrations well. What is to be taken into account here is that an elliptical pupil to be measured is scanned using circular subapertures. In this case, regions of the wavefronts determined via phase retrieval overlap. To be able to use this to calculate the entire elliptical entrance pupil to be measured, it can be desirable for the basis of a function decomposition for the individual wavefronts is chosen in such a way that it is describable by way of a shift/rotation.

Zernike polynomials are suitable as basis functions as a matter of principle. Bhatia-Wolf polynomials, Bessel functions, solutions to the Laplace equation, orthogonalized, locally distributed, narrow exponential functions and/or Gaussian functions (optionally distributed on a grid), orthogonalized, locally distributed spline polynomials (optionally distributed on a grid) and orthogonalized mixtures of basis functions were found to be advantageous in respect of the describability of a shift/rotation.

In this case, the orthogonalization of the functions improves a robustness of the optimization and a comparability of the results. A partial orthogonalization of the basis functions is also possible.

A mixture of the possible basis functions listed above may also be particularly suitable, for example a combination of Zernike polynomials and orthogonalized, locally distributed, narrow exponential functions. To this end, a small number of Zernike polynomials, for example 9 to 16 Zernike polynomials, are used to describe the conventional imaging aberrations in this way. Additionally, localized Pilk functions, for example in the form of an exponential function or a Gaussian function, are used to be able to describe local deviations. In this case, the exponential functions are partially orthogonalized with respect to the Zernike functions. A partial orthogonalization of a function set F with respect to another function set G is understood to mean that each element of F is converted with the aid of a method such that it is subsequently orthogonal to all elements of G. By way of example, this can be implemented using the orthogonalization step of the Gram-Schmidt orthogonalization method. The difference to complete orthogonalization is that the elements in F and G need not necessarily be orthogonal amongst themselves.

By way of example, such an orthogonalization can be implemented using the GramSchmidt orthogonalization method (D. Malacara, "Optical Shop Testing", Wiley-Interscience, 1992; http://de.wikipedia.org/wiki/Schmidtsches_Orthonormalisierungsverfahren).

Figure 24:
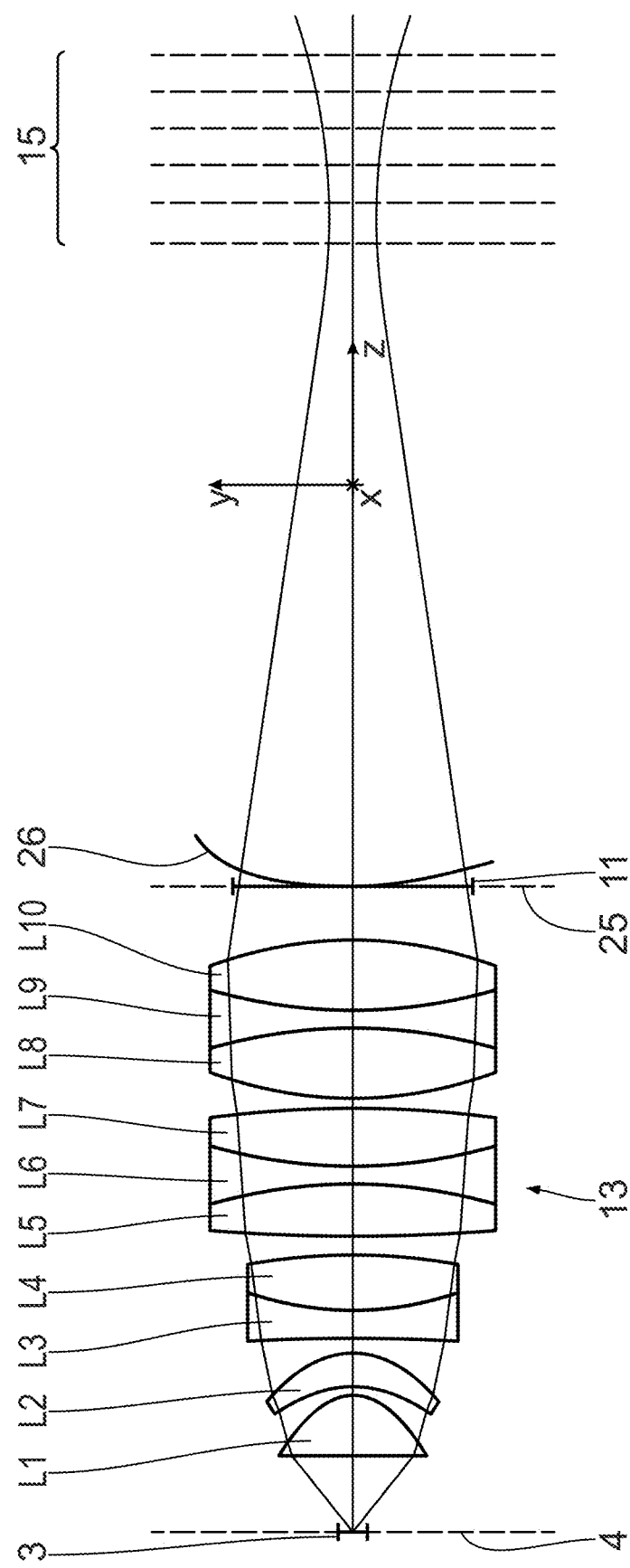
FIG. 24 shows a representation, less schematically in relation to the imaging optical unit, of an imaging system having a plurality of lenses which may be used in a further embodiment of a metrology system in place of the metrology system according to FIG. 1, the imaging system being represented between an object plane and image planes of a focus stack to be measured.

FIG. 24 shows an embodiment of the metrology system 2 between the object plane 4 and the image plane 15 for the purposes of elucidating the phase retrieval method. Components and functions corresponding to those which have already been described with reference to the above-described figures, particularly with reference to FIG. 1, bear the same reference signs and will not be discussed in detail again. The situation when using illumination light 1 at a wavelength μ=193 nm and a pinhole stop as a test structure 5 in the object plane 4 is depicted. The projection optical unit 13 is elucidated as a system of lenses with a total of 10 lenses L1 to L10. Moreover, a pupil plane 25 of the projection optical unit 13 to be measured, which is optically conjugate to the illumination optical unit pupil plane 9, is depicted.

FIG. 24 moreover elucidates a wave surface 26 of a wavefront of the optical system to be measured, on the basis of which the imaging quality of the optical system is described. By way of example, FIG. 23 shows a phase profile of such a wave surface 26 in the pupil plane.

In addition to the image plane 15 in which the detection device 14 is arranged, FIG. 24 shows further parallel reflective image planes at a distance therefrom, which further reflective image planes arise on account of the displacement of the test object 5 in the z-direction. As an alternative thereto, the detection device 14 can also be displaced in the z-direction; this is elucidated in FIG. 24.

The following relationship can be constructed for the intensity I(x, y, z) measured by the detection device 14:

$$I = \text{abs}(H^{pupil\_image}(H^{object\_pupil}(E_{object}) \cdot E_{pupil}))^2 + N \quad (2)$$

In this case, $H^{object\_pupil}$ is an optical transfer function between the object plane 4 and the pupil 11 in the pupil plane 25;

$H^{pupil\_image}$ is an optical transfer function between the pupil 11 and the image plane 15;

$E_{object}$ is a complex amplitude (amplitude and phase) of the test object 5;

$E_{pupil}$ is a system transfer function in the form of a complex pupil amplitude, that is to say the desired wave function of the optical system; and N is a contribution which describes, inter alia, the noise in the detection device 14.

Within the scope of the phase retrieval, the wave function $E_{pupil}$ is back-calculated from the measured intensity value I.

In this case, a forward simulation of the imaging of the test object 5 by the projection optical unit 3 is implemented and a difference between a simulation parameterized in the aberrations, that is to say in the imaging aberrations, and the measurement results I is minimized.

If an anamorphic projection optical unit 13 is used, the simulation is to be adapted in accordance with the anamorphic set up. A simulation formulation based on Fourier transforms lends itself to the realization of a fast and exact simulation.

The elliptically shaped pupil 11 of the projection optical unit to be parameterized to this end can be parameterized via the following variants:

Firstly, the pupil function can be represented on a square grid together with an elliptical apodization and a parameterization of the pupil function by way of compressed Zernike is polynomials, that is to say Zernike polynomials that are scaled differently in the x- and y-directions. This is visualized in exemplary fashion in FIGS. 25 and 26 which show an example of a parameterization of the elliptical pupil 11, represented thus, in an equidistant kx- and ky-grid (square grid). Within the elliptical edge of the pupil 11, there is a description as a linear combination of appropriately compressed Zernike polynomials. Outside the elliptical boundary, the pupil function is set to zero within a circle with the radius of the ellipse semimajor axis (zero padding).

Figure 25:
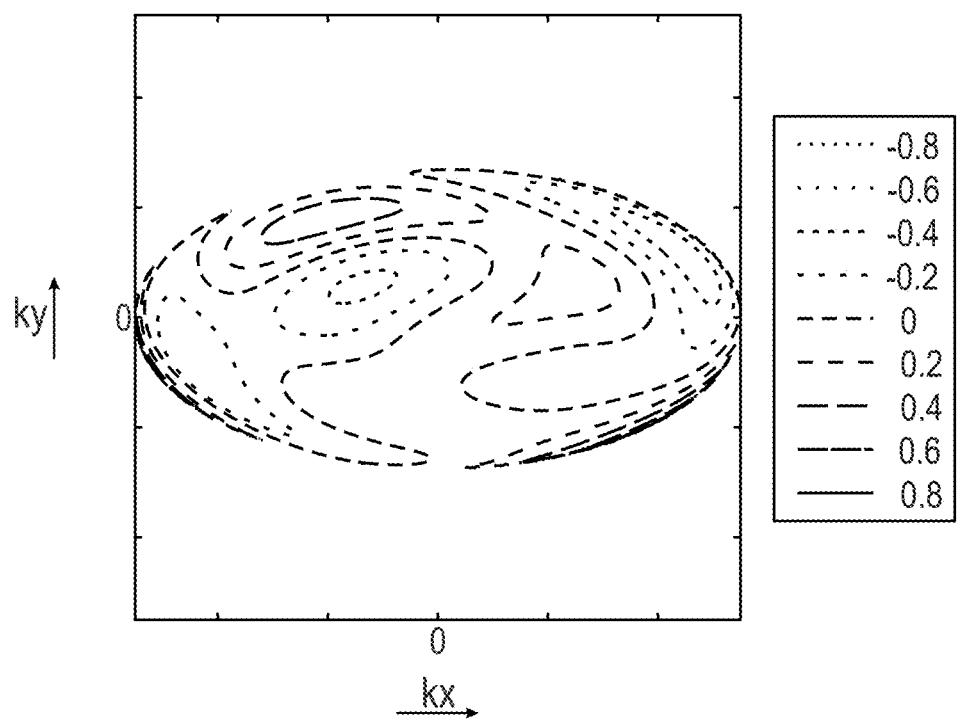
FIG. 25 shows an example of a phase distribution in an exit pupil to be measured of an anamorphic optical system, represented on a square grid with an elliptic apodization, parameterized in accordance with an ellipticity corresponding to compressed Zernike polynomials.
Figure 26:
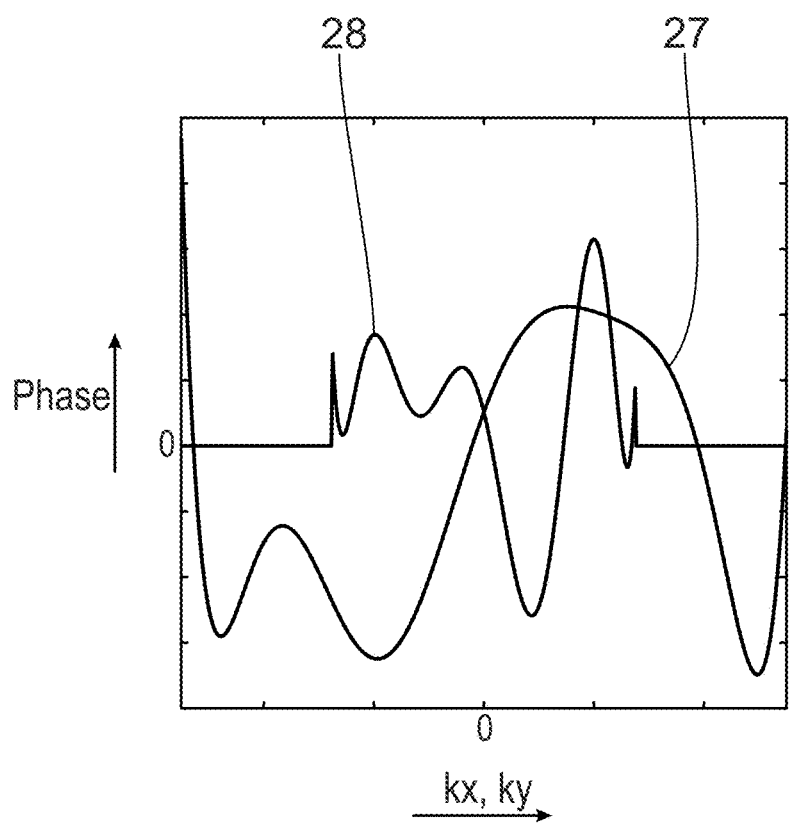
FIG. 26 shows sections through the pupil function according to FIG. 25 along a semimajor and a semiminor axis of the elliptical pupil mask.

FIG. 26 shows a section through the pupil function depicted in FIG. 25 in a (kx, ky)-plan view, firstly in the kx-direction (cut line 27) and secondly in the ky-direction (cut line 28).

A variant of the representation of the pupil function is implemented on a non-square pupil grid, that is to say in which the scaling differs in the kx- and ky-directions. The scaling of the grids, that is to say the grid widths in kx and ky, is coupled to the absolute values of the associated numerical apertures NAx, NAy of the elliptical pupil 11. Then, in respect of the pixels, this representation has a circular apodization and a parameterization of the pupil function by way of conventional Zernike polynomials, and not by way of compressed Zernike polynomials. Within the scope of the simulation, the different grid widths in kx and ky then are taken into account in the scaling of the Fourier transform. In this case, either use can be made of an adapted zero padding or use can be made of a chirp Z-transform, in which different adapted scaling parameters should be selected. The pupil grid widths in kx and ky can be chosen in such a way that the pupil function is maximally scanned and numerically has the highest information density.

Figure 27:
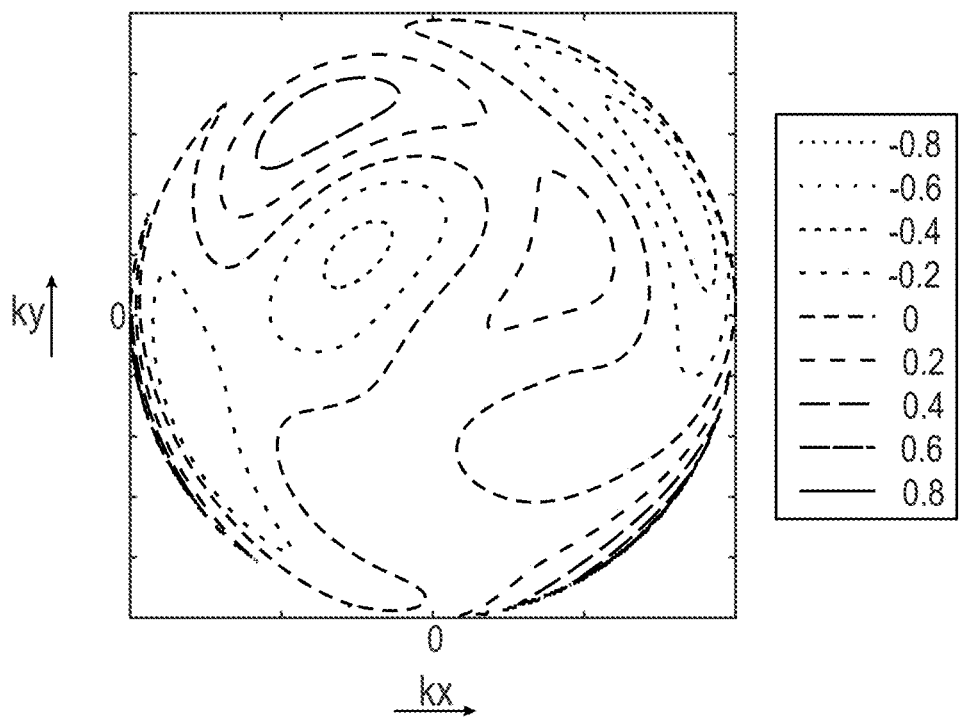
FIG. 27 shows, in a representation similar to FIG. 25, the pupil function according to FIG. 25 represented on a non-square pupil grid, which has been matched to the principal axis ratio of the elliptical exit pupil, with a circular apodization and parameterization of the pupil function by way of conventional, non-compressed Zernike polynomials.
Figure 28:
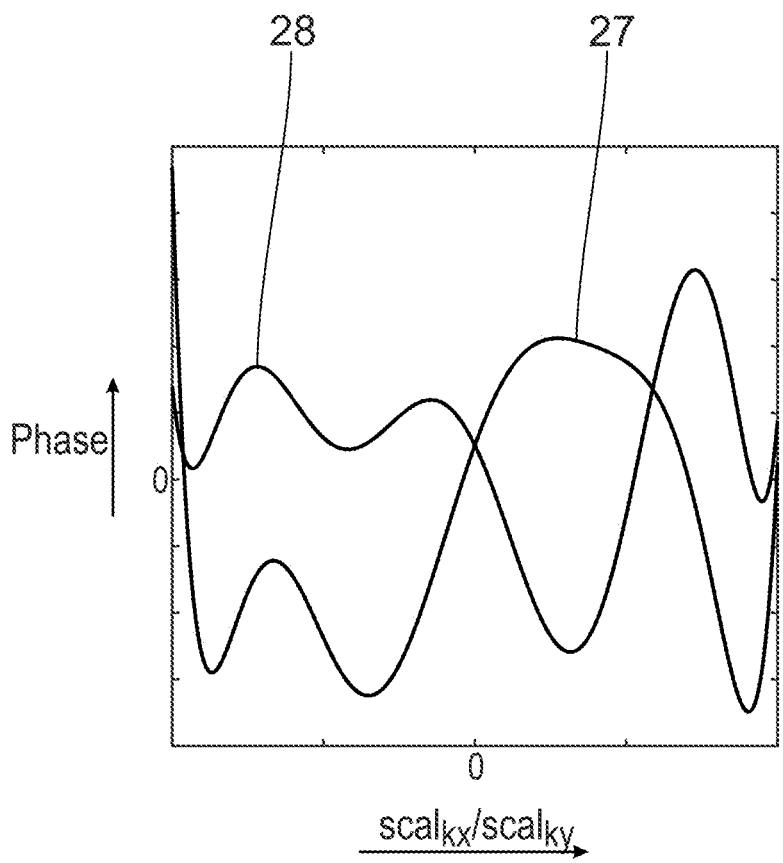
FIG. 28 shows, in a representation similar to FIG. 26, two sections through the pupil function according to FIG. 27 along the two orthogonal principal axes.

FIGS. 27 and 28 show the representation of an exemplary pupil function which corresponds to that according to FIGS. 25 and 26, in accordance with this variant with the non-square pupil grid and the circular apodization. It should be observed that the pupil coordinates kx, ky are scaled differently in FIGS. 27 and 28.

The scaling factor $scal_{x/y}$ of the chirp Z-transform between a given pixel grid of the detection device 14 and the x- and y-grid according to the pupil representation according to FIGS. 27 and 28 with maximum scanning of the pupil function is calculated as:

$$scal_{x/y} = \frac{\lambda}{2 \cdot dx/dy \cdot NA_{x/y}} \quad (3)$$

Here:
$\lambda$ is the wavelength of the illumination light 1;
dx (dy) is the pixel dimension and
$NA_{x/y}$ is the numerical aperture of the pupil 11 in the x- and y-directions.

Then, different scalings arise in the x- and y-directions depending on the different numerical apertures $NA_x$, $NA_y$ of the pupil 11.

As a rule, the following applies: dx=dy. However, the pixel dimensions of the detection device 14 in the x- and y-directions may, in principle, also be chosen to be different.

A further variant of the calculation lies in the use of a so-called error reduction algorithm, either with a conventional FFT and use of an elliptical apodization matrix or with the chirp Z-transform, adapted scaling parameters and the use of a circular apodization matrix. As a result, it is then possible in turn to alternate between pupil space and image space, the corresponding restrictions being implemented in the respective space (like in the case of the conventional IFTA algorithm, also referred to as Gerchberg-Saxton algorithm).

Using the representation variants for the pupil function explained above, it is possible on the one hand to represent the entire entrance pupil 11 to be measured, or else the subapertures $10_i$.

The measurement above was implemented with round subapertures $10_i$. In principle, the is measurement can also be carried out using elliptically bounded subapertures. This can likewise be used to determine the aberrations over an elliptical entrance pupil. In this case, measurements can be carried out directly using an elliptical stop at the location of the stops 8 and 11a, respectively.

What is claimed is:

1. A method, comprising:
a) for each of a plurality of different distance positions of a test structure relative to an object plane of an optical system, illuminating the test structure with a specified illumination angle distribution corresponding to a subaperture within a pupil of the optical system;
b) for each of the different distance positions, measuring a spatially resolved distribution of an intensity of the illumination light in an image plane of the optical system using a spatially resolving detection device, the illumination light having been guided by the optical system;
c) determining an aerial image of the test structure using the measured spatially resolved distribution of the intensity of the illumination light in the image plane at each of the different distance positions;
d) comparing the determined aerial image with a simulated aerial image and adapting fit parameters of a function set to describe the simulated aerial image until a difference between the determined aerial image and the simulated aerial image has been reduced to a desired value;
e) determining a wavefront of the optical system based on the result of the reduced difference between the determined and the simulated aerial image;
f) repeating a) through d) using a different subaperture within the pupil;
g) determining a combined wavefront of the optical system by combining the determined wavefronts over the entire pupil; and
eliminating a test structure contribution to an influence on the wavefront by the test structure to determine a test structure-independent imaging quality of the optical system,
wherein:
a linear system of equations is solved for determining the test structure-independent imaging quality of the optical system while eliminating the test structure contribution; and
the linear system of equations comprises data of the determined combined wavefront prior to the elimination of the test structure contribution, contributions of the test structure, and a transformation matrix.

2. The method of claim 1, wherein the desired value is a minimum value.

3. The method of claim 1, comprising using the subapertures to scan the pupil.

4. The method of claim 1, wherein:
e) comprises determining the test structure contribution for exactly one specified subaperture; and
f) comprises using the test structure contribution for the exactly one specified subaperture to determine the test structure-independent imaging quality of the optical system for the second subaperture.

5. The method of claim 1, wherein:
a dependence of at least one parameter on a respective coordinate in a solution space to be determined is described by a decomposition into basis functions; and
the at least one parameter comprises a member selected from the group consisting of the data of the combined determined wavefront prior to the elimination of the test structure contribution, the contributions of the test structure, and the transformation matrix.

6. The method of claim 1, wherein the test structure comprises a pinhole.

7. The method of claim 1, wherein the test structure comprises a pinhole comprising an elliptical edge.

8. The method of claim 1, wherein:
the pupil comprises an elliptical edge;
within the determination of the combined wavefront, there is a representation of a pupil function for an at least sectional description of the pupil on a coordinate grid that is equidistant in mutually perpendicular pupil coordinates and parameterized basis functions that are scaled in accordance with a principal axis ratio of an elliptical edge of the pupil.

9. The method of claim 1, wherein:
the pupil comprises an elliptical edge; and
there is within the determination of the combined wavefront, a representation of a pupil function for the at least sectional description of the pupil on a coordinate grid that is scaled in mutually perpendicular pupil coordinates in accordance with a principal axis ratio of the elliptical edge of the pupil and parameterized basis functions that are scaled uniformly.

10. The method of claim 1, further comprising using a metrology system comprising an imaging optical unit to image the test structure toward a spatially resolving detection device.

11. The method of claim 10, comprising using the subapertures to scan the pupil.

12. The method of claim 1, further comprising using a metrology system which comprises:
   an illumination optical unit configured to illuminate a test structure in an object plane in which the test structure is present;
   a spatially resolving detection device;
   an imaging optical unit configured to image the test structure toward the spatially resolving device in an image plane; and
   a stop comprising an aperture having an elliptical edge,
   wherein the stop is an illumination pupil plane of the imaging optical unit and/or in an entrance pupil of the imaging optical unit.

13. The method of claim 12, comprising using the subapertures to scan the pupil.

14. A metrology system, comprising:
   an illumination optical unit configured to illuminate a test structure in an object plane in which the test structure is present;
   a spatially resolving detection device;
   an imaging optical unit configured to image the test structure toward the spatially resolving detection device in an image plane;
   a stop comprising an aperture having an elliptical edge; and
   a controller configured so that during use of the metrology system:
      a) for each of a plurality of different distance positions of a test structure relative to an object plane of an optical system, the illumination optical unit illuminates a test structure with a specified illumination angle distribution corresponding to a subaperture of the optical system;
      b) for each of the different distance positions, the spatially resolving detection device measures a spatially resolved distribution of an intensity of the illumination light in an image plane of the optical system using a spatially resolving detection device, the illumination light having been guided by the optical system;
      c) an aerial image of the test structure is determined using the measured spatially resolved distribution of the intensity of the illumination light in the image plane at each of the different distance positions;
      d) the determined aerial image is compared with a simulated aerial image and fit parameters of a function set to describe the simulated aerial image are adapted until a difference between the determined aerial image and the simulated aerial image has been reduced to a desired value;
      e) a wavefront of the optical system is determined based on the result of the reduced difference between the measured and the simulated aerial image;
      f) a) through e) are repeated using a different subaperture within the pupil; and
      g) a combined wavefront of the optical system is determined by combining the determined wavefronts over the entire pupil,
   wherein the stop is an illumination pupil plane of the imaging optical unit and/or in an entrance pupil of the imaging optical unit, and
   wherein the controller is further configured so that during use of the metrology system:
      a test structure contribution to an influence on the wavefront by the test structure is eliminated to determine a test structure-independent imaging quality of the optical system; and
      a linear system of equations is solved for determining the imaging quality while eliminating the test structure contribution; and
      the linear system of equations comprises data of the determined combined wavefront prior to the elimination of the test structure contribution, contributions of the test structure, and a transformation matrix.

15. The metrology system of claim 14, wherein the controller is configured so that during use of the metrology system the subapertures are used to scan the pupil.

16. The method of claim 3, wherein the desired value is a minimum value.

17. The method of claim 3, wherein:
   e) comprises determining the test structure contribution for exactly one specified subaperture; and
   f) comprises using the test structure contribution for the exactly one specified subaperture to determine the test structure-independent imaging quality of the optical system for the second subaperture.

18. The method of claim 3, wherein:
   a dependence of at least one parameter on a respective coordinate in a solution space to be determined is described by a decomposition into basis functions; and
   the at least one parameter comprises a member selected from the group consisting of the data of the combined determined wavefront prior to the elimination of the test structure contribution, the contributions of the test structure, and the transformation matrix.

19. The method of claim 3, wherein the test structure comprises a pinhole.

20. The method of claim 3, wherein the test structure comprises a pinhole comprising an elliptical edge.

* * * * *